United States Patent
Chen et al.

(10) Patent No.: US 10,627,641 B2
(45) Date of Patent: Apr. 21, 2020

(54) 3D DISPLAY PANEL ASSEMBLY, 3D DISPLAY DEVICE AND DRIVING METHOD THEREOF

(71) Applicants: BOE Technology Group Co., Ltd., Beijing (CN); Beijing BOE Optoelectronics Technology Co., Ltd., Beijing (CN)

(72) Inventors: Xiaochuan Chen, Beijing (CN); Pengcheng Lu, Beijing (CN); Wenqing Zhao, Beijing (CN); Ming Yang, Beijing (CN); Rui Xu, Beijing (CN); Lei Wang, Beijing (CN); Jian Gao, Beijing (CN); Xiaochen Niu, Beijing (CN); Xue Dong, Beijing (CN); Haisheng Wang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 48 days.

(21) Appl. No.: 15/508,593

(22) PCT Filed: Aug. 26, 2016

(86) PCT No.: PCT/CN2016/096826
§ 371 (c)(1),
(2) Date: Mar. 3, 2017

(87) PCT Pub. No.: WO2017/096964
PCT Pub. Date: Jun. 15, 2017

(65) Prior Publication Data
US 2018/0239157 A1    Aug. 23, 2018

(30) Foreign Application Priority Data
Dec. 9, 2015 (CN) .......................... 2015 1 0907679

(51) Int. Cl.
*G02B 27/22* (2018.01)
*G09G 3/20* (2006.01)
(Continued)

(52) U.S. Cl.
CPC ... *G02B 27/2214* (2013.01); *G02F 1/133621* (2013.01); *G02F 1/134309* (2013.01);
(Continued)

(58) Field of Classification Search
USPC ....................................... 345/419
See application file for complete search history.

(56) References Cited

U.S. PATENT DOCUMENTS 9,852,701 B2 * 12/2017 Kurasawa ............ G09G 3/3607
2010/0118045 A1 * 5/2010 Brown Elliott .... G02B 27/2214
345/589
(Continued)

FOREIGN PATENT DOCUMENTS

CN   102628999 A   8/2012
CN   102970573 A   3/2013
(Continued)

OTHER PUBLICATIONS

Jun. 12, 2017—(CN) First Office Action Appn 201510907679.7 with English Tran.
(Continued)

*Primary Examiner* — Yi Wang
(74) *Attorney, Agent, or Firm* — Banner & Witcoff, Ltd.

(57) ABSTRACT

A 3D display panel assembly includes a display panel and an adjusting panel. The display panel includes a plurality of subpixels arranged in an array, any two adjacent lines along a first direction being respectively a first subpixel line and a second subpixel line, the first subpixel line including first subpixels configured to emit primary light, and the second subpixel line including second subpixels configured to dis-
(Continued)

play black when the first subpixel line emits the primary light. The adjusting panel includes a plurality of adjusting units arranged in an array, each line along a second direction including a plurality of continuously arranged first adjusting unit groups. A 3D display device and a method for driving the same are also provided.

22 Claims, 12 Drawing Sheets

(51) Int. Cl.
*G09G 3/00* (2006.01)
*H01L 27/32* (2006.01)
*H04N 13/302* (2018.01)
*G02F 1/13357* (2006.01)
*G02F 1/1343* (2006.01)
*G09G 3/36* (2006.01)
*H04N 13/128* (2018.01)
*G09G 3/3275* (2016.01)
*H04N 13/00* (2018.01)

(52) U.S. Cl.
CPC .......... *G09G 3/003* (2013.01); *G09G 3/2003* (2013.01); *G09G 3/3607* (2013.01); *H01L 27/3218* (2013.01); *H01L 27/3225* (2013.01); *H01L 27/3232* (2013.01); *H04N 13/302* (2018.05); *G02F 2001/134345* (2013.01); *G02F 2201/121* (2013.01); *G02F 2201/123* (2013.01); *G02F 2201/44* (2013.01); *G02F 2203/30* (2013.01); *G09G 3/3275* (2013.01); *G09G 2320/0209* (2013.01); *G09G 2340/0492* (2013.01); *H04N 13/128* (2018.05); *H04N 2013/0077* (2013.01)

(56) References Cited

U.S. PATENT DOCUMENTS

| | | | |
|---|---|---|---|
| 2011/0285763 A1* | 11/2011 | Bassi | G06T 5/008 345/694 |
| 2011/0310121 A1* | 12/2011 | Baron | G09G 3/003 345/634 |
| 2012/0146995 A1* | 6/2012 | Lee | G09G 3/20 345/419 |
| 2012/0287148 A1* | 11/2012 | Brown Elliott | G09G 5/02 345/593 |
| 2012/0320011 A1 | 12/2012 | Koyama | |
| 2013/0106923 A1* | 5/2013 | Shields | G09G 3/3406 345/690 |
| 2013/0215360 A1* | 8/2013 | Pollack | G09G 3/3413 349/61 |
| 2014/0063001 A1* | 3/2014 | Kim | G02B 27/2264 345/419 |
| 2014/0098204 A1* | 4/2014 | Kang | G02B 27/2228 348/58 |
| 2015/0002532 A1* | 1/2015 | Sone | G09G 3/003 345/593 |
| 2015/0198813 A1 | 7/2015 | Hirakata et al. | |
| 2017/0069277 A1* | 3/2017 | Hsieh | G09G 3/3607 |

FOREIGN PATENT DOCUMENTS

| | | |
|---|---|---|
| CN | 104777622 A | 7/2015 |
| CN | 105353559 A | 2/2016 |
| CN | 105425405 A | 3/2016 |
| CN | 205139482 U | 4/2016 |
| JP | 2009103866 A | 5/2009 |
| JP | 5071041 B2 | 11/2012 |

OTHER PUBLICATIONS

Nov. 30, 2016—(WO) International Search Report and Written Opinion Appn PCT/CN2016/096826 with English Tran.

* cited by examiner

3D DISPLAY PANEL ASSEMBLY, 3D DISPLAY DEVICE AND DRIVING METHOD THEREOF

The application is a U.S. National Phase Entry of International Application No. PCT/CN2016/096826 filed on Aug. 26, 2016, designating the United States of America and claiming priority to Chinese Patent Application No. 201510907679.7, filed on Dec. 9, 2015. The present application claims priority to and the benefit of the above-identified applications and the above-identified applications are incorporated by reference herein in their entirety.

TECHNICAL FIELD

Embodiments of the present disclosure relate to a three-dimensional (3D) display panel assembly, a 3D display device and a driving method thereof.

BACKGROUND

In recent years, stereo display, namely 3D display, has become a trend in the display field. Compared with common 2D display, 3D technology allows the screen to be stereo and realistic, and images are no longer limited to the screen plane, as if they can be out of the screen, so that the audience can have an immersed sense. Although the 3D display technology has numerous classifications, the most basic principle thereof is similar and is to utilize the left eye and the right eye of the human being to respectively receive different images. As the spacing between the two eyes of the human being is about 65 mm, this position difference allows the left eye and the right eye to view different 2D images, then information of different 2D images is superimposed and regenerated via the brain to form an image having 3D effect in the front-back, up-down, left-right, far-near directions.

SUMMARY

Embodiments of the present disclosure provide a 3D display panel assembly, a 3D display device and a driving method thereof. The display device has a novel 3D display structure.

According to at least one embodiment of the present disclosure, a 3D display panel assembly is provided, including a display panel and an adjusting panel provided on a light-emitting side of the display panel. The display panel includes a plurality of subpixels arranged in an array, the plurality of subpixels being arranged in a plurality of lines along a first direction and arranged in a plurality of lines along a second direction. The first direction is parallel to a connecting line of a left eye and a right eye. Any two adjacent lines along the first direction are respectively a first subpixel line and a second subpixel line. The first subpixel includes first subpixels configured to emit primary light. The second subpixel line includes second subpixels configured to display black when the first subpixel line emits the primary light. The adjusting panel includes a plurality of adjusting units arranged in an array, the plurality of adjusting units being arranged in a plurality of lines along the first direction and arranged in a plurality of lines along the second direction. The adjusting unit is configured to adjust light transmittance. Each line along the second direction includes a plurality of continuously arranged first adjusting unit groups. Each first adjusting unit group includes two adjusting units, one being a first left-eye adjusting unit and the other being a first right-eye adjusting unit. Each first subpixel corresponds to one first adjusting unit group, and primary light emitted by the first subpixel may run through a first left-eye adjusting unit in corresponding first adjusting unit group and is received by the left eye, and runs through a first right-eye adjusting unit in the first adjusting unit group and is received by the right eye; and the first direction and the second direction are perpendicular to each other.

For example, the 3D display panel assembly rotates 90 degrees to allow the second direction to be parallel to the connecting line of the left eye and the right eye. In this case, any two adjacent lines along the second direction in the display panel are respectively a third subpixel line and a fourth subpixel line. The third subpixel line includes third subpixels configured to emit primary light; and the fourth subpixel line includes fourth subpixels configured to display black when the third subpixel line emits the primary light. Each line along the first direction in the adjusting panel includes a plurality of continuously arranged second adjusting unit groups. Each second adjusting unit group includes two adjusting units, one being a second left-eye adjusting unit and the other being a second right-eye adjusting unit. Each third subpixel corresponds to one second adjusting unit group; and primary light emitted by the third subpixel may run through a second left-eye adjusting unit in corresponding second adjusting unit group and is received by the left eye, and runs through a second right-eye adjusting unit in the second adjusting unit group and is received by the right eye.

For example, the display panel is an organic light-emitting diode (OLED) display panel; the first subpixel and the second subpixel respectively include an OLED luminous unit; or the first subpixel includes an OLED luminous unit, and a black matrix (BM) is provided at a corresponding position of the second subpixel.

For example, the display panel is an OLED display panel; and subpixels on the display panel respectively include an OLED luminous unit.

For example, the adjusting panel is a liquid crystal display (LCD) adjusting panel which includes an array substrate and a package substrate assembled together, and liquid crystals provided between the array substrate and the package substrate. Common electrodes and pixel electrodes arranged in an array are formed on the array substrate and/or the package substrate, and each adjusting unit includes a pixel electrode.

For example, in an instance that the subpixels on the display panel respectively include an OLED luminous unit, any three adjacent subpixels along the first direction and/or the second direction may respectively display three different primary colors R, G, and B; or a subpixel group is formed by four subpixels in two adjacent lines along the first direction and two adjacent lines along the second direction; each subpixel group displays a same color; and any three adjacent subpixel groups respectively display three different primary colors R, G, and B.

For example, each adjusting unit includes at least two subunits; and each subunit may independently adjust the transmittance thereof.

According to at least one embodiment of the present disclosure, a 3D display device is provided, including: the 3D display panel assembly, a first processing unit connected with the display panel in the 3D display panel assembly, and a second processing unit connected with the adjusting panel in the 3D display panel assembly. In an instance that the first direction is parallel to the connecting line of the left eye and the right eye, the first processing unit is configured to output first control signals to the display panel in the 3D display panel assembly, so that the first subpixel lines in the display panel can emit primary light and the second subpixel lines can display black when the first subpixel lines emit the primary light; and the second processing unit is configured to output first image data to the adjusting panel in the 3D display panel assembly, and the first image data includes a gray scale of the first left-eye adjusting unit and a gray scale of the first right-eye adjusting unit in each first adjusting unit group of the adjusting panel.

For example, the first image data are 3D image data and include a gray scale of a left-eye image and a gray scale of a right-eye image, and the second processing unit is configured to output the gray scale of the left-eye image to the first left-eye adjusting unit in each first adjusting unit group, and output the gray scale of the right-eye image to the first right-eye adjusting unit in each first adjusting unit group; or the first image data are 2D image data, and the processing unit is configured to output same gray scale to the first left-eye adjusting unit and the first right-eye adjusting unit in the same first adjusting unit group.

For example, the 3D display device further includes a 2D/3D switching control unit connected with the second processing unit and configured to send a switching instruction to the second processing unit when a switching request signal is received, and the second processing unit is further configured to receive a switching instruction sent by the 2D/3D switching control unit and determine the first image data required to be displayed after switching according to the switching instruction.

For example, in an instance that each adjusting unit includes at least two subunits, the first image data include a gray scale of each subunit in each first adjusting unit group of the adjusting panel.

For example, in an instance that the 3D display panel assembly rotates 90 degrees and the second direction is parallel to the connecting line of the left eye and the right eye, the first processing unit is further configured to output second control signals to the display panel in the 3D display panel assembly, so that the third subpixel lines in the display panel can emit primary light and the fourth subpixel lines can display black when the third subpixel lines emit the primary light; and the second processing unit is further configured to output second image data to the adjusting panel in the 3D display panel assembly, and the second image data includes a gray scale of the second left-eye adjusting unit and a gray scale of the second right-eye adjusting unit in each second adjusting unit group of the adjusting panel.

For example, the second image data are 3D image data and include the gray scale of the left-eye image and the gray scale of the right-eye image, and the second processing unit is configured to output the gray scale of the left-eye image to the second left-eye adjusting unit in each second adjusting unit group, and output the gray scale of the right-eye image to the second right-eye adjusting unit in each second adjusting unit group; or the second image data are 2D image data, and the processing unit is configured to output a same gray scale to the second left-eye adjusting unit and the second right-eye adjusting unit in the same second adjusting unit group.

For example, the 3D display device further includes a 2D/3D switching control unit. In this case, the second processing unit is further configured to receive a switching instruction sent by the 2D/3D switching control unit and determine the second image data required to be displayed after switching according to the switching instruction.

For example, in an instance that the subpixels on the display panel respectively include an OLED luminous unit, the 3D display device further includes a landscape and portrait detecting unit connected with the first processing unit and the second processing unit and configured to detect the landscape and portrait status of the 3D display device and send the landscape and portrait status to the first processing unit and the second processing unit. The first processing unit is further configured to receive the landscape and portrait status of the 3D display device sent by the landscape and portrait detecting unit, and determine the output of the first control signals or the second control signals to the display panel in the 3D display panel assembly according to the landscape and portrait status of the 3D display device; and the second processing unit is further configured to receive the landscape and portrait status of the 3D display device sent by the landscape and portrait detecting unit, and determine the output of the first image data or the second image data to the adjusting panel in the 3D display panel assembly according to the landscape and portrait status of the 3D display device.

For example, in an instance that each adjusting unit includes at least two subunits, the second image data include a gray scale of each subunit in each second adjusting unit group of the adjusting panel.

According to embodiments of the present disclosure, a method for driving the 3D display device is provided. In an instance that the first direction is parallel to the connecting line of the left eye and the right eye, the driving method includes: outputting first control signals to the display panel in the 3D display panel assembly, so that the first subpixel lines in the display panel can emit primary light and the second subpixel lines can display black when the first subpixel lines emit the primary light; and outputting first image data to the adjusting panel in the 3D display panel assembly, in which the first image data include the gray scale of the first left-eye adjusting unit and the gray scale of the first right-eye adjusting unit in each first adjusting unit group of the adjusting panel.

For example, the first image data are 3D image data and include the gray scale of the left-eye image and the gray scale of the right-eye image, and the second processing unit is configured to output the gray scale of the left-eye image to the first left-eye adjusting unit in each first adjusting unit group, and output the gray scale of the right-eye image to the first right-eye adjusting unit in each first adjusting unit group; or the first image data are 2D image data, and the processing unit is configured to output same gray scale to the first left-eye adjusting unit and the first right-eye adjusting unit in the same first adjusting unit group.

For example, the method further includes before outputting the first image data to the adjusting panel in the 3D display panel assembly, determining the first image data required to be displayed after switching when a 2D/3D switching request signal is received.

For example, in an instance that each adjusting unit includes at least two subunits, the first image data include the gray scale of each subunit in each first adjusting unit group of the adjusting panel.

For example, in an instance that the 3D display panel assembly rotates 90 degrees and the second direction is parallel to the connecting line of the left eye and the right eye, the driving method further includes outputting second control signals to the display panel in the 3D display panel assembly, so that the third subpixel lines in the display panel emit primary light and the fourth subpixel lines display black when the third subpixel lines emit the primary light; and outputting second image data to the adjusting panel in the 3D display panel assembly, in which the second image data further includes the gray scale of the second left-eye adjusting unit and the gray scale of the second right-eye adjusting unit in each second adjusting unit group of the adjusting panel.

For example, the second image data are 3D image data and include the gray scale of the left-eye image and the gray scale of the right-eye image, and the second processing unit is configured to output the gray scale of the left-eye image to the second left-eye adjusting unit in each second adjusting unit group, and output the gray scale of the right-eye image to the second right-eye adjusting unit in each second adjusting unit group; or the second image data are 2D image data, and the processing unit is configured to output same gray scale to the second left-eye adjusting unit and the second right-eye adjusting unit in the same second adjusting unit group.

For example, the method further includes before outputting the second image data to the adjusting panel in the 3D display panel assembly, determining the second image data required to be displayed after switching when the switching request signal is received.

For example, in an instance that the subpixels on the display panel respectively include an OLED luminous unit, before outputting the first control signals or the second control signals to the display panel in the 3D display panel assembly, and before outputting the first image data or the second image data to the adjusting panel in the 3D display panel assembly, detecting a landscape and portrait status of the 3D display device; determining the output of the first control signals or the second control signals to the display panel in the 3D display panel assembly according to the landscape and portrait status of the 3D display device; and determining the output of the first image data or the second image data to the adjusting panel in the 3D display panel assembly according to the landscape and portrait status of the 3D display device.

For example, in an instance that each adjusting unit includes at least two subunits, the second image data include the gray scale of each subunit in each second adjusting unit group of the adjusting panel.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Technical solutions of the embodiments will be described in a clearly and understandable way connected with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and if the position of the object which is described is changed, the relative position relationship may be changed accordingly.

Figure 1:
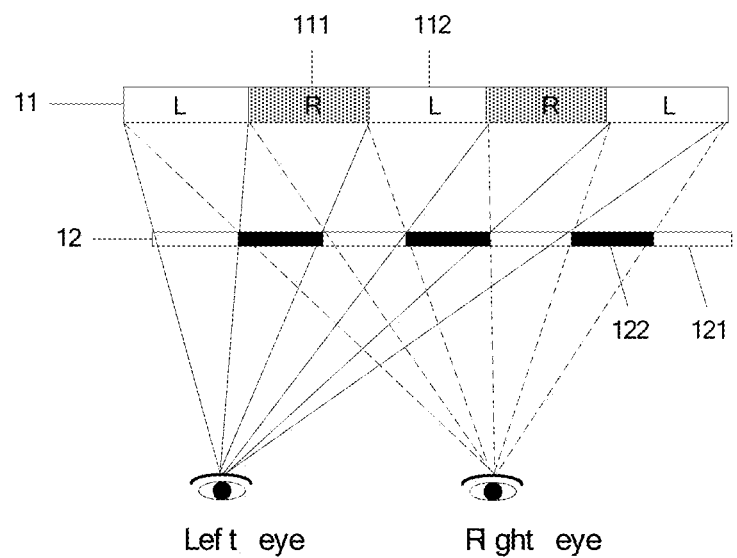
FIG. 1 is a schematic diagram of a 3D display device.

The current mainstream 3D display technology is implemented via special glasses, so the application range and the use comfort thereof are greatly reduced. As shown in FIG. 1, a glasses-free 3D display device includes a 3D display panel 11 and a grating 12 disposed on a light emergent side of the 3D display panel 11. The 3D display panel 11 includes a plurality of first display units 111 and a plurality of second display units 112. The first display unit 111 displays a left-eye image L, and the second display unit 112 displays a right-eye image R. The grating 12 includes light transmitting areas 121 and light-shielding areas 122. Thus, the grating 12 has image-splitting function. As illustrated in FIG. 1, the left eye of the human being can only view the left-eye image L, and the right eye can only view the right-eye image R, so that stereo perception can be produced.

An embodiment of the present disclosure provides a new 3D display structure.

Figure 2:
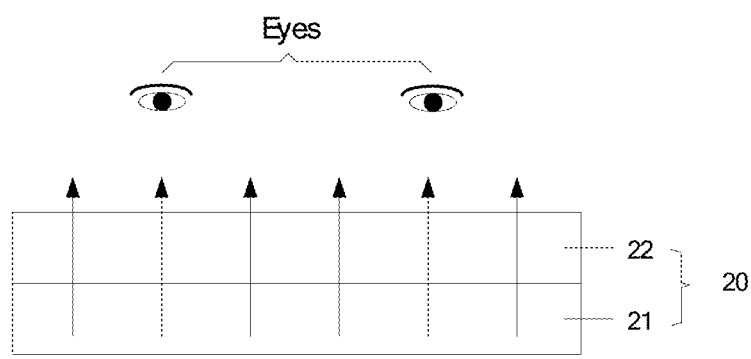
FIG. 2 is a schematic diagram of a 3D display panel assembly provided by an embodiment of the present disclosure.

As illustrated in FIG. 2, the embodiment of the present disclosure provides a 3D display panel assembly 20, which includes a display panel 21 and an adjusting panel 22 disposed on a light-emergent side of the display panel 21.

Figure 3:
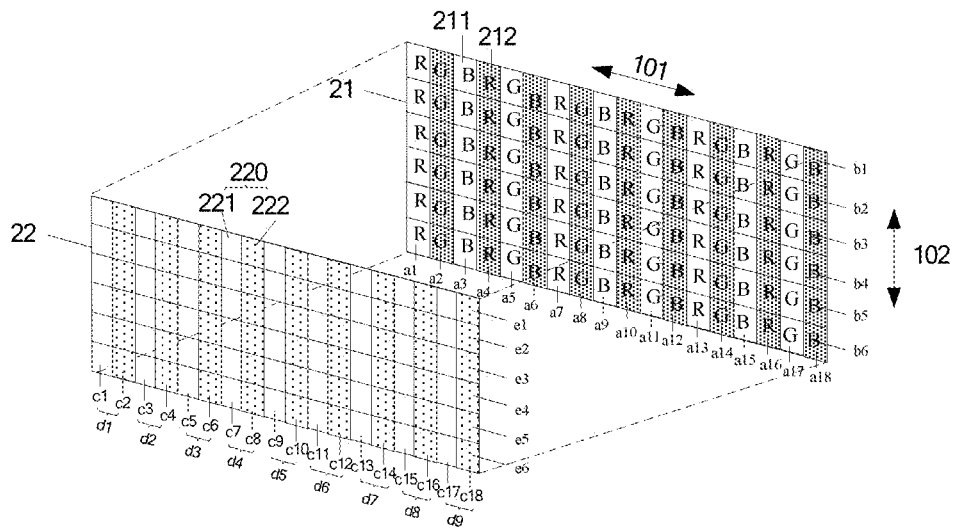
FIG. 3 is a schematic diagram of a first display status of the display panel assembly as shown in FIG. 2.

As illustrated in FIG. 3, the display panel 21 includes a plurality of subpixels arranged in an array. The plurality of subpixels are arranged in a plurality of lines along a first direction (e.g., the 101 direction as shown in FIG. 3) and arranged in a plurality of lines along a second direction (e.g., the 102 direction as shown in FIG. 3). The first direction (e.g., the 101 direction as shown in FIG. 3) is parallel to a connecting line of the left eye and the right eye. Any two adjacent lines along the first direction are respectively a first subpixel line 211 and a second subpixel line 212. The first subpixel line 211 includes first subpixels and is configured to emit primary light; and the second subpixel line 212 includes second subpixels and is configured to display black when the first subpixel line emits the primary light. The first direction and the second direction are perpendicular to each other.

Description is given in FIG. 3 by taking the case that a1-a18 lines of subpixels are formed along the first direction and b1-b6 lines of subpixels are formed along the second direction in the display panel 21 as an example. The a1, a3, a5, a7, a9, a11, a13, a15 and a17 lines along the first direction are the first subpixel lines 211, and the a2, a4, a6, a8, a10, a12, a14, a16 and a18 lines along the first direction are the second subpixel lines 212.

Description is given in FIG. 3 by taking the case that each first subpixel line 211 along the first direction, namely the 101 direction, displays one primary color as an example. As illustrated in FIG. 3, first subpixels in the a1, a7 and a13 lines display red (R); first subpixels in the a5, a11 and a17 lines display green (G); and first subpixels in the a3, a9 and a15 lines display blue (B). The first subpixels disposed in the same first subpixel line may also display different colors.

As the plurality of subpixels are arranged in an array, the first direction may be the row direction and the second direction is the column direction. Or vice verse, the first direction is the column direction and the second direction is the row direction. Detailed description is given in the embodiments of the present disclosure and the accompanying drawings by taking the case that the first direction is the row direction, namely the long-side direction, and the second direction is the column direction, namely the short-side direction, as an example.

The adjusting panel 22 includes a plurality of adjusting units arranged in an array; the plurality of adjusting units are arranged in a plurality of lines along the first direction (namely the 101 direction as shown in FIG. 3) and arranged in a plurality of lines along the second direction (namely the 102 direction as shown in FIG. 3); and the adjusting unit is configured to adjust the light transmittance. Each line along the second direction (namely the 102 direction as shown in FIG. 3) includes a plurality of continuously arranged first adjusting unit groups 220. Each first adjusting unit group 220 includes two adjusting units, in which one is a first left-eye adjusting unit 221 and the other is a first right-eye adjusting unit 222.

Description is given in FIG. 3 by taking the case that c1-c18 lines of adjusting units are formed along the first direction, namely the 101 direction, and e1-e6 lines of adjusting units are formed along the second direction, namely the 102 direction, in the adjusting panel 22, as an example. Each line in the e1-e6 lines along the second direction, namely the 102 direction, includes 18 adjusting units; the 18 adjusting units are divided into 9 continuously arranged first adjusting unit groups 220, namely d1-d9; and each first adjusting unit group 220 includes two adjusting units, in which one is a first left-eye adjusting unit 221 and the other is a first right-eye adjusting unit 222. As illustrated in FIG. 3, the first adjusting unit group d1 includes a first left-eye adjusting unit corresponding to the c1 line and a first right-eye adjusting unit corresponding to the c2 line; the first adjusting unit group d2 includes a first left-eye adjusting unit corresponding to the c3 line and a first right-eye adjusting unit corresponding to the c4 line; the first adjusting unit group d3 includes a first left-eye adjusting unit corresponding to the c5 line and a first right-eye adjusting unit corresponding to the c6 line; the first adjusting unit group d4 includes a first left-eye adjusting unit corresponding to the c7 line and a first right-eye adjusting unit corresponding to the c8 line; the first adjusting unit group d5 includes a first left-eye adjusting unit corresponding to the c9 line and a first right-eye adjusting unit corresponding to the c10 line; the first adjusting unit group d6 includes a first left-eye adjusting unit corresponding to the c11 line and a first right-eye adjusting unit corresponding the c12 line; the first adjusting unit group d7 includes a first left-eye adjusting unit corresponding to the c13 line and a first right-eye adjusting unit corresponding to the c14 line; the first adjusting unit group d8 includes a first left-eye adjusting unit corresponding to the c15 line and a first right-eye adjusting unit corresponding to the c16 line; and the first adjusting unit group d9 includes a first left-eye adjusting unit corresponding to the c17 line and a first right-eye adjusting unit corresponding to the c18 line. That is to say, the connecting line of the left eye and the right eye is parallel to the first direction.

Each first subpixel corresponds to one first adjusting unit group. Primary light emitted by the first subpixel may run through a first left-eye adjusting unit in corresponding first adjusting unit group and is received by the left eye, and runs through a first right-eye adjusting unit in the adjusting unit group and is received by the right eye.

Figure 4:
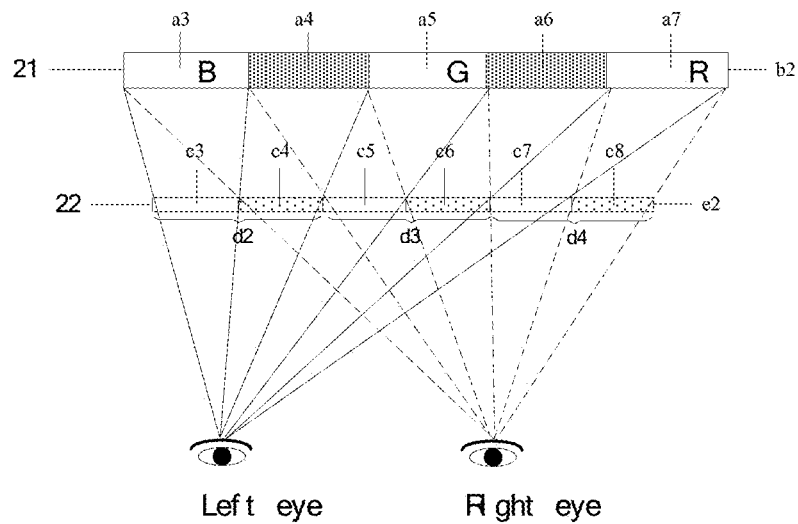
FIG. 4 is a schematic diagram illustrating the process of achieving 3D display in the display status as shown in FIG. 3.

Description is given in FIG. 4 by taking a3-a7 lines along the first direction and a b2 line along the second direction in a display panel 21, and c3-c8 lines along the first direction and an e2 line along the second direction in a corresponding display panel 22, as an example. A first subpixel in the a3 line corresponds to a first adjusting unit group d2; and blue light emitted by the first subpixel in the a3 line runs through a first left-eye adjusting unit in the c3 line in the corresponding first adjusting unit group d2 and is received by the left eye, and runs through a first right-eye adjusting unit in the c4 line in the first adjusting unit group d2 and is received by the right eye. A first subpixel in the a5 line corresponds to a first adjusting unit group d3; and green light emitted by the first subpixel in the a5 line runs through a first left-eye adjusting unit in the c5 line in a corresponding first adjusting unit group d3 and is received by the left eye, and runs through a first right-eye adjusting unit in the c6 line in the first adjusting unit group d3 and is received by the right eye. A first subpixel in the a7 line corresponds to a first adjusting unit group d4; and red light emitted by the first subpixel in the a7 line runs through a first left-eye adjusting unit in the c7 line in a corresponding first adjusting unit group d4 and is received by the left eye, and runs through a first right-eye adjusting unit in the c8 line in the first adjusting unit group d4 and is received by the right eye.

As the second subpixel line displays black, images viewed by the left eye and the right eye view through the first left-eye adjusting unit and the first right-eye adjusting unit on the adjusting panel are all black. As illustrated in FIG. 4, second subpixels in the a4 line and the a6 line received by the left eye and the right eye respectively are all black.

That is to say, in the embodiment of the present disclosure, as the first direction is parallel to the connecting line of the left eye and the right eye, any first subpixel is received by the left eye through the first left-eye adjusting unit and received by the right eye through the first right-eye adjusting unit. As the transmittance of the first left-eye adjusting unit and the first right-eye adjusting unit may be defferrent, if the first left-eye adjusting unit has the gray scale of a left-eye image and the first right-eye adjusting unit has the gray scale of a right-eye image, even in the same first subpixel, the gray scale of the image viewed by the left eye and the gray scale of the image viewed by the right eye are different. In this way, the left-eye image and the right-eye image are respectively received by the left eye and the right eye of the user, then information of different 2D images is superimposed and regenerated via the brain to form an image having 3D effect in the front-back, up-down, left-right and far-near directions, namely a 3D image can be viewed.

Description is given in the embodiment of the present disclosure by taking the case that the first direction, namely the 101 direction as shown in FIG. 3, is perpendicular to the second direction, namely the 102 direction as shown in FIG. 3, as an example. It is noted that: for instance, if the display panel assembly as shown in FIG. 3 is a panel assembly of a mobile phone, the long-side direction of the mobile phone may be the first direction and the short-side direction of the mobile phone is the second direction. Vice verse, the short side of the mobile phone may be the first direction and the long side is the second direction. Description is given in the embodiment of the present disclosure by only taking those as shown in the accompanying drawings as an example. However, the embodiments of the present disclosure are not limited thereto.

The embodiment of the present disclosure provides a 3D display panel assembly, which includes a display panel and an adjusting panel. The display panel includes subpixels arranged in an array; any two adjacent lines in various lines of subpixels are respectively a first subpixel line and a second subpixel line; the first subpixel line includes first subpixels and is configured to emit primary light; and the second subpixel line includes second subpixels and is configured to display black when the first subpixel line displays an image. The adjusting panel includes adjusting units arranged in an array; the adjusting unit is configured to adjust the light transmittance; each line of the adjusting units includes a plurality of continuously arranged first adjusting unit groups; and each first adjusting unit group includes two adjusting units, in which one is a first left-eye adjusting unit and the other is a first right-eye adjusting unit. The second subpixel viewed by the left eye and the right eye through the first left-eye adjusting unit and the first right-eye adjusting unit is black. Each first subpixel corresponds to one first adjusting unit group; and primary light emitted by the first subpixel may run through a first left-eye adjusting unit in corresponding first adjusting unit group and is received by the left eye, and runs through a first right-eye adjusting unit in the first adjusting unit group and is received by the right eye. That is to say, the gray scale of the same first subpixel viewed by the left eye and the right eye is different, so that the left-eye image and the right-eye image can be respectively received by the left eye and the right eye, then, information of different 2D images can be superimposed and regenerated via the brain to form an image having 3D effect in the front-back, up-down, left-right and far-near directions, namely a 3D image can be viewed.

For instance, the display panel is an OLED display panel; the first subpixel and the second subpixel respectively includes an OLED luminous member; or the first subpixel includes an OLED luminous member, and a BM is disposed at a corresponding position of the second subpixel.

Figure 5:
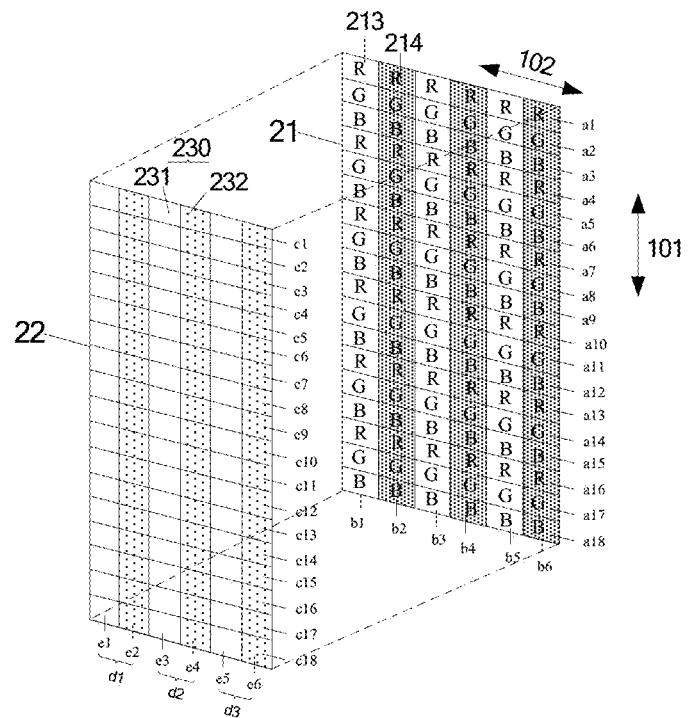
FIG. 5 is a schematic diagram of a second display status of the display panel assembly as shown in FIG. 2.

For instance, as illustrated in FIG. 5, the 3D display panel assembly as shown in FIG. 3 rotates 90 degrees, so that the second direction, namely the 102 direction, is parallel to the connecting line of the left eye and the right eye. Any two adjacent lines along the second direction, namely the 102 direction, in the display panel 21 are respectively a third subpixel line 213 and a fourth subpixel line 214; the third subpixel line 213 includes third subpixels and is configured to emit primary light; and the fourth subpixel line 214 includes fourth subpixels and displays black when the third subpixel line 213 emits the primary light.

As a panel assembly as shown in FIG. 5 is obtained by rotating the panel assembly in FIG. 3 by 90 degrees, the same as the display panel 21 in FIG. 3, in the display panel 21 as shown in FIG. 5, a1-a18 lines of subpixels are formed along the first direction, namely the 101 direction, and b1-b6 lines of subpixels are formed along the second direction, namely the 102 direction. In the panel assembly as shown in FIG. 5, the second direction is parallel to the connecting line of the left eye and the right eye, so b1, b3 and b5 lines along the second direction, namely the 102 direction, are third subpixel lines 211, and b2, b4 and b6 lines along the second direction, namely the 102 direction, are fourth subpixel lines 212.

Each third subpixel line 213 in FIG. 5 displays three different primary colors, Red (R), Green (G) and Blue (B). For instance, third subpixels in the b1 line display three different primary colors, Red (R), Green (G) and Blue (B); third subpixels in the b3 line display three different primary colors, Red (R), Green (G) and Blue (B); and third subpixels in the b5 line displays three different primary colors, Red (R), Green (G) and Blue (B). The third subpixels disposed in the same third subpixel line may also display the same primary color, which is relevant to the primary color displayed by the subpixels in FIG. 3. Description is given in the embodiment of the present disclosure by only taking the case as shown in FIG. 3 as an example. The primary colors displayed by the subpixels in FIG. 5 are the same as the primary colors displayed by the subpixels in FIG. 3.

Each line of the adjusting panel 22 includes a plurality of continuously arranged second adjusting unit groups 230 along the first direction, namely the 101 direction. Each second adjusting unit group 230 includes two adjusting units, in which one is a second left-eye adjusting unit 231 and the other is a second right-eye adjusting unit 232.

Each third subpixel corresponds to one second adjusting unit group. Primary light emitted by the third subpixel may run through a second left-eye adjusting unit 231 in corresponding second adjusting unit group 230 and is received by the left eye, and runs through a second right-eye adjusting unit 232 in the second adjusting unit group 230 and is received by the right eye.

In the adjusting panel 22 as shown in FIG. 5, c1-c18 lines of adjusting units are formed along the first direction, namely the 101 direction, and e1-e6 lines of adjusting units are formed along the second direction, namely the 102 direction. Each line in the c1-c18 lines of adjusting units includes 6 adjusting units; the 6 adjusting units are divided into 3 continuously arranged second adjusting unit groups 230, namely d1-d3; and each second adjusting unit group 230 includes two adjusting units, in which one is a second left-eye adjusting unit 231 and the other is a second right-eye adjusting unit 232. As illustrated in FIG. 3, the second adjusting unit group d1 includes a second left-eye adjusting unit corresponding to the e1 line and a second right-eye adjusting unit corresponding to the e2 line; the second adjusting unit group d2 includes a second left-eye adjusting unit corresponding to the e3 line and a second right-eye adjusting unit corresponding to the e4 line; and the second adjusting unit group d3 includes a second left-eye adjusting unit corresponding to the e5 line and a second right-eye adjusting unit corresponding to the e6 line.

Figure 6:
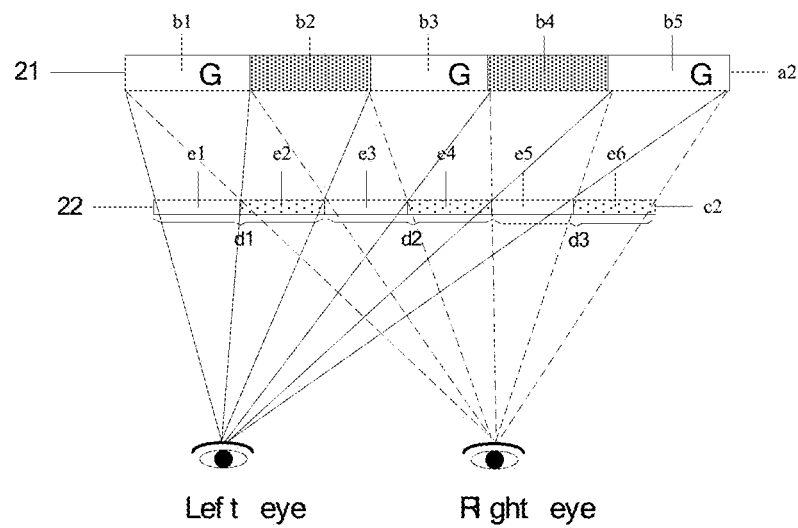
FIG. 6 is a schematic diagram illustrating the process of achieving 3D display in the display status as shown in FIG. 5.

As illustrated in FIG. 6, description is given by taking b1-b5 lines along the second direction and an a2 line along the first direction in the display panel 21, and e1-e6 lines along the second direction and a c2 line along the first direction in corresponding adjusting panel 22, as an example. A third subpixel in the b1 line corresponds to an adjusting unit group d1; and green light emitted by the third subpixel in the b1 line runs through a second left-eye adjusting unit in the e1 line in corresponding second adjusting unit group d1 and is received by the left eye, and runs through a second right-eye adjusting unit in the e2 line in the second adjusting unit group d1 and is received by the right eye. A third subpixel in the b3 line corresponds to an adjusting unit group d2; and green light emitted by the third subpixel in the b3 line runs through a second left-eye adjusting unit in the e3 line in corresponding second adjusting unit group d2 and is received by the left eye, and runs through a second right-eye adjusting unit in the e4 line in the second adjusting unit group d2 and is received by the right eye. A third subpixel in the b5 line corresponds to an adjusting unit group d3; and green light emitted by the third subpixel in the b5 line runs through a second left-eye adjusting unit in the e5 line in corresponding second adjusting unit group d3 and is received by the left eye, and runs through a second right-eye adjusting unit in the e6 line in the second adjusting unit group d3 and is received by the right eye.

As the fourth subpixel line displays black, the fourth subpixel line viewed by the left eye and the right eye through the left-eye adjusting unit and the right-eye adjusting unit on the adjusting panel is all black. As illustrated in FIG. 6, fourth subpixels in the b2 line and the b4 line received by the left eye and the right eye are all black.

In the display panel assembly as shown in FIG. 5, any third subpixel is received by the left eye through the second left-eye adjusting unit and received by the right eye through the second right-eye adjusting unit. As the transmittance of the second left-eye adjusting unit and the second right-eye adjusting unit may be different, if the second left-eye adjusting unit has the gray scale of the left-eye image and the second right-eye adjusting unit has the gray scale of the right-eye image, even in the same third subpixel, the gray scale of the image viewed by the left eye and the gray scale of the image viewed by the right eye are different. In this way, the left-eye image and the right-eye image are respectively received by the left eye and the right eye of the user, then information of different 2D images is superimposed and regenerated via the brain to form an image having 3D effect in the front-back, up-down, left-right and far-near directions, namely a 3D image can be viewed.

In the embodiment of the present disclosure, as the 3D display panel assembly 20 as shown in FIG. 5 may be obtained by rotating the 3D display panel assembly 20 as shown in FIG. 3 by 90 degrees, the 3D display panel assembly 20 can all achieve 3D display in various above conditions. For instance, the 3D display panel assembly provided by the embodiments of the present disclosure may be applied to a mobile phone, so that the mobile phone can achieve 3D display in the mode of landscape or portrait.

For instance, in an instance that the display panel assembly can still achieve 3D display after rotating 90 degrees, the display panel is an OLED display panel; subpixels on the display panel respectively include an OLED luminous member; and second subpixel lines or fourth subpixel lines may be controlled to be black, so that the display panel assembly can achieve 3D display in the mode of landscape or portrait, as shown by the cases in FIGS. 3 and 5.

It is noted that in the embodiment of the present disclosure, first subpixels in first subpixel lines may emit primary light, or partial first subpixels may display black, so that black second subpixels are not used for image display.

Figure 7:
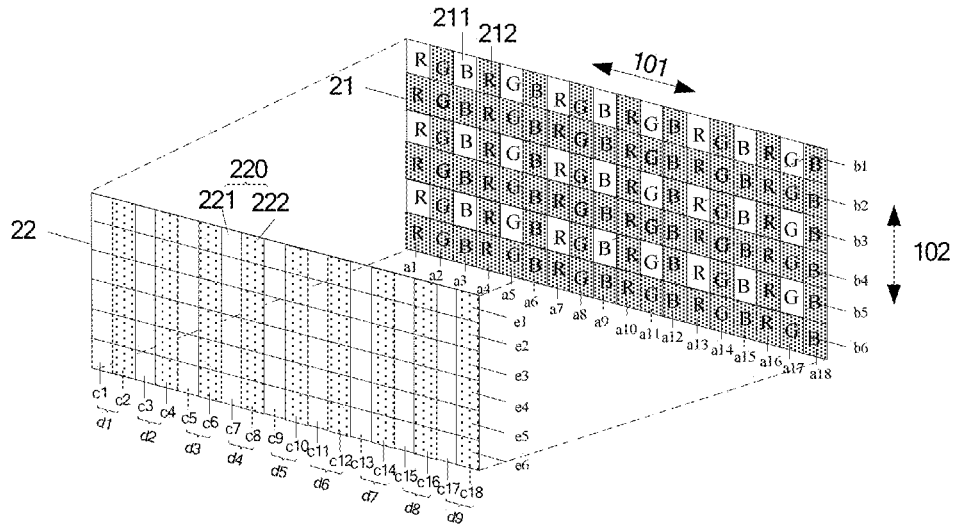
FIG. 7 is a schematic diagram of a third display status of the display panel assembly as shown in FIG. 2.

As illustrated in FIG. 7, taking the panel assembly 20 as shown in FIG. 3 as an example, partial first subpixels in first subpixel lines 211 do not display primary color but display black. Moreover, in the embodiment of the present disclosure, black first subpixels in the first subpixel lines 211 are arranged in a plurality of lines along the second direction, namely first subpixels in b2, b4 and b6 lines along the second direction, namely the 102 direction, display black. In this way, the black first subpixels lines and the black second subpixel lines are intersected to each other to form a black matrix (BM).

Similarly, in the embodiment of the present disclosure, third subpixels in third subpixel lines may emit primary light, or partial third subpixels display black, so that black fourth subpixels are not used for image display.

Figure 8:
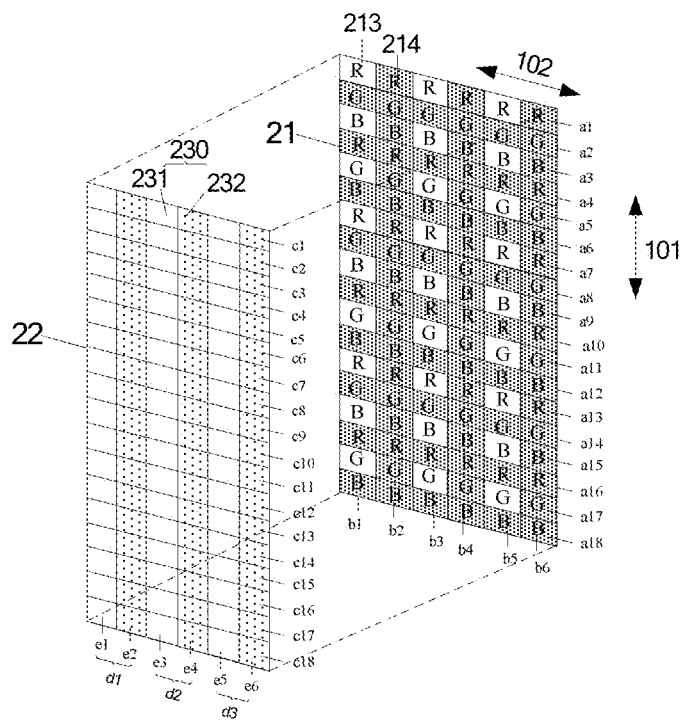
FIG. 8 is a schematic diagram of a fourth display status of the display panel assembly as shown in FIG. 2.

As illustrated in FIG. 8, taking the display panel assembly as shown in FIG. 5 as an example, any two adjacent lines along the second direction, namely the 102 direction, are respectively a third subpixel line 213 and a fourth subpixel line 214, in which partial third subpixels in each third subpixel line 213 do not display primary color but display black. As illustrated in FIG. 7, taking the case that third subpixels in a2, a4, a6, a8, a10, a12, a14, a16 and a18 lines along the first direction, namely the 101 direction, display black as an example, the black third subpixels and fourth subpixel lines are intersected to each other to form a black matrix.

The display panel assemblies 20 as shown in FIGS. 3 and 5 may be obtained by rotating 90 degrees. Similarly, the display panel assemblies 20 as shown in FIGS. 7 and 8 may be obtained by rotating 90 degrees.

It is noted that: as illustrated in FIG. 3, if the first subpixel includes an OLED luminous member and a BM is disposed at a corresponding position of the second subpixel, as the BM can no longer achieve display change, the case is as shown in FIG. 3 or as shown in FIG. 5, namely 3D display can be achieved only in the case of landscape (as shown in FIG. 3) or portrait (as shown in FIG. 5).

However, if the BMs are crisscrossed, as shown in FIGS. 7 and 8, the display panel assembly may also achieve 3D display in a mode of landscape and portrait.

For instance, the adjusting panel is a LCD adjusting panel which includes an array substrate and a package substrate which are cell-assembled together, and liquid crystals disposed between the array substrate and the package substrate. Common electrodes and pixel electrodes arranged in an array are formed on the array substrate and/or the package substrate, and each adjusting unit includes a pixel electrode.

Different voltages may be applied to each pixel electrode on the array substrate through thin-film field-effect transistors (TFTs), and the voltage applied to the common electrodes may be same, so that the electric field between the common electrode and the pixel electrode corresponding to each adjusting unit may be different. In this way, the transmittance of each adjusting unit can be different by controlling the deflection angle of the liquid crystals.

In the LCD adjusting panel, the common electrodes and the pixel electrodes may be formed on the array substrate; or the common electrodes and the pixel electrodes may be formed on the package substrate; or the pixel electrodes are formed on the array substrate and the common electrodes are formed on the package substrate. That is to say, the electric field between the pixel electrodes and the common electrodes may be vertical electric field or horizontal electric field. No specific limitation will be given to the display mode of the LCD adjusting panel in the embodiment of the present disclosure.

For instance, in an instance that the subpixels on the display panel respectively include an OLED luminous member, any three adjacent subpixels along the first direction and/or the second direction may respectively display three different primary colors R, G, and B.

FIG. 3 takes the case that any three adjacent subpixels along the first direction, namely the 101 direction, may respectively display three different primary colors R, G, and B, as an example, namely any three adjacent subpixels in the b1, b2, b3, b4, b5 and b6 lines may respectively display three different primary colors R, G, and B. Each first subpixel line 211 along the first direction, namely the 101 direction, only displays the same color, namely first subpixels in the a1, a7 and a13 lines display Red (R); first subpixels in the a5, a11 and a17 lines display Green (G); and first subpixels in the a3, a9 and a15 lines display Blue (B). Any subpixel line displays the same color. In this way, after the display panel assembly as shown in FIG. 3 rotates 90 degrees, the display panel is as shown in FIG. 5: first subpixels in the a1, a4, a7, a10, a13 and a16 lines along the first direction, namely the 101 direction, display R; first subpixels in the a2, a5, a8, a11, a14 and a17 lines display G; and first subpixels in the a3, a6, a9, a12, a15 and a18 lines display B. But any three adjacent subpixels in the first subpixel line 213 among the b1-b6 lines of subpixels along the second direction may display three different primary colors R, G, and B. In this way, the color blending of the first subpixels in the b1-b6 lines can be relatively uniform, so that the effect of color display can be improved.

That is to say, in an instance that three adjacent subpixels along the first direction or the second direction may respectively display three different primary colors R, G, and B, in the display panel assembly as shown in FIG. 3 or 5, any three adjacent subpixels along one direction respectively display three different primary colors R, G, and B. In this way, the color blending of the subpixels along one direction in the display panel can be relatively uniform, so that the effect of color display can be improved.

If three adjacent subpixels along the first direction and the second direction may respectively display three different primary colors R, G, and B, after the display panel assembly rotates 90 degrees, any three adjacent subpixels along the first direction and the second direction respectively display three different primary colors R, G, and B no matter in a mode of landscape or in a mode of portrait. In this way, the color blending of the subpixels can be more uniform, so that the effect of color display can be improved.

Figure 9:
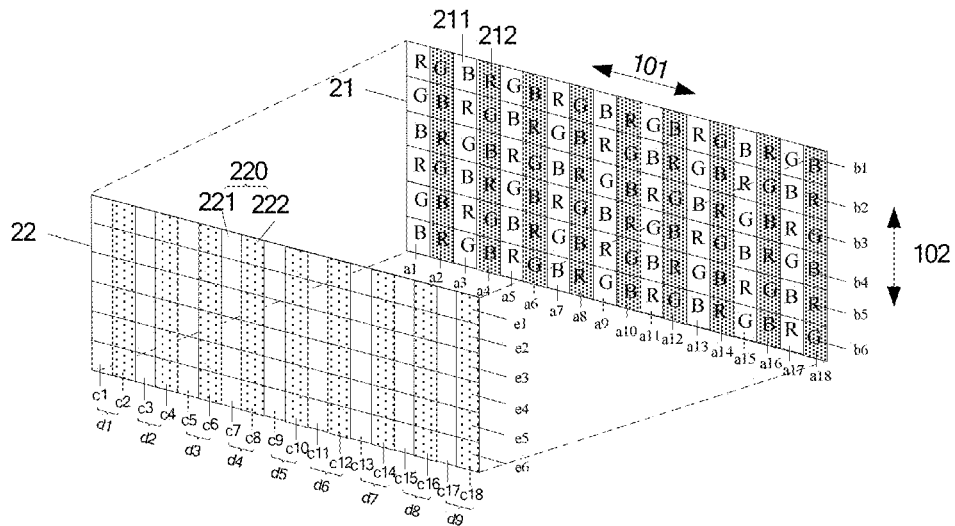
FIG. 9 is a schematic diagram of a fifth display status of the display panel assembly as shown in FIG. 2.
Figure 10:
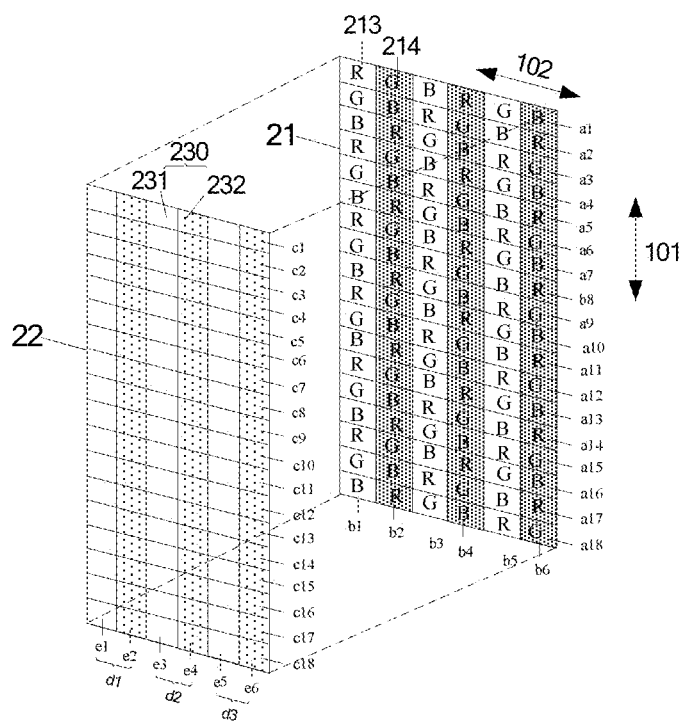
FIG. 10 is a schematic diagram of a sixth display status of the display panel assembly as shown in FIG. 2.

As illustrated in FIG. 9, three adjacent subpixels in each line of subpixels among a1-a18 lines respectively display three different primary colors R, G, and B, and three adjacent subpixels in each line of subpixels among b1-b6 lines respectively display three different primary colors R, G, and B. In this way, any three adjacent first subpixels along the first direction, namely the 101 direction, and along the second direction, namely the 102 direction, respectively display three different primary colors R, G, and B. A display panel assembly 20 as shown in FIG. 10 is obtained by rotating the display panel assembly as shown in FIG. 9 by 90 degrees. Any three adjacent third subpixels along the first direction, namely the 101 direction, and along the second direction, namely the 102 direction, respectively display three different primary colors R, G, and B.

In this way, a pixel unit may be formed by any three adjacent subpixels along the first direction and the second direction. The display panel assembly displays an image through a plurality of display units along the first direction and the second direction, so that the display panel assembly can have better image display effect.

Figure 11:
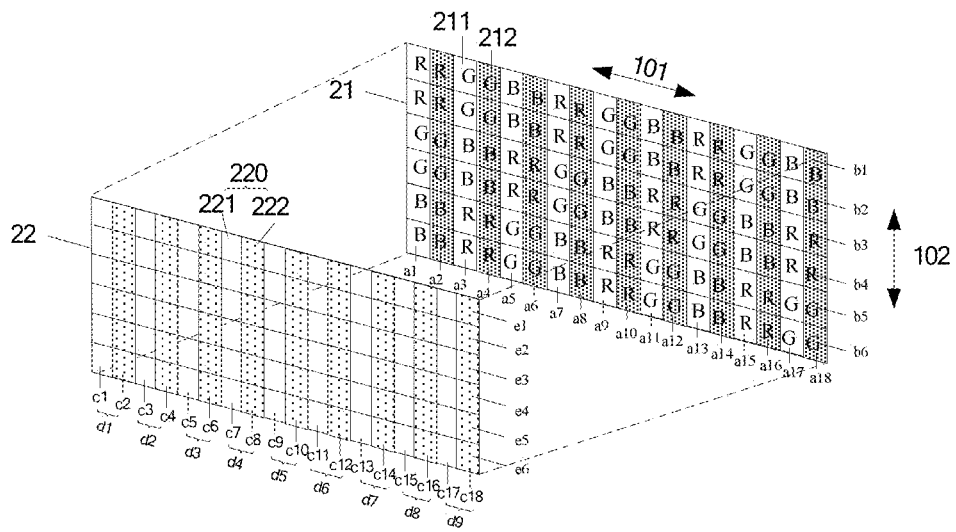
FIG. 11 is a schematic diagram of a seventh display status of the display panel assembly as shown in FIG. 2.

For instance, a subpixel group is formed by four subpixels in any two adjacent lines along the first direction and the second direction; each subpixel group displays the same color; and any three adjacent subpixel groups respectively display three different primary colors R, G, and B. As illustrated in FIG. 11, a subpixel group is formed by four subpixels in a1 and a2 lines along the first direction, namely the 101 direction, and b1 and b2 lines along the second direction, namely the 102 direction, and the four subpixels display R; a subpixel group is formed by four subpixels in a3 and a4 lines along the first direction, namely the 101 direction, and the b1 and b2 lines along the second direction, namely the 102 direction, and the four subpixels display G; and a subpixel group is formed by four subpixels in a5 and a6 lines along the first direction, namely the 101 direction, and the b1 and b2 lines along the second direction, namely the 102 direction, and the four subpixels display B. That is to say, three subpixel groups along the first direction respectively display three different primary colors R, G, and B.

A subpixel group is formed by four subpixels in the a1 and a2 lines along the first direction, namely the 101 direction, and b3 and b4 lines along the second direction, namely the 102 direction, and the four subpixels display G; and a subpixel group is formed by four subpixels in the a1 and a2 lines along the first direction, namely the 101 direction, and b5 and b6 lines along the second direction, namely the 102 direction, and the four subpixels display B. That is to say, three subpixel groups along the second direction respectively display three different primary colors R, G, and B.

Figure 12:
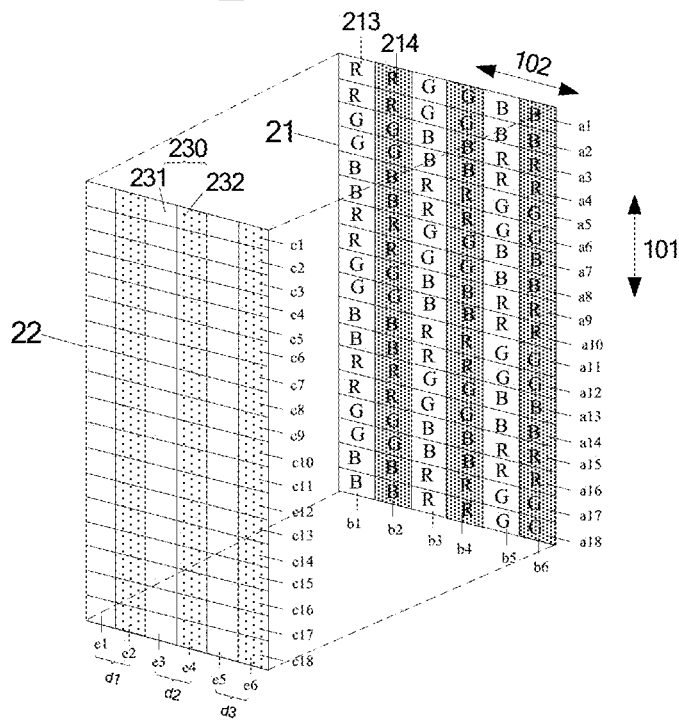
FIG. 12 is a schematic diagram of an eighth display status of the display panel assembly as shown in FIG. 2.

A 3D display panel assembly as shown in FIG. 12 is obtained by rotating the 3D display panel assembly as shown in FIG. 11 by 90 degrees. In the 3D display panel assembly as shown in FIG. 12, three subpixel groups along the first direction respectively display three different primary colors R, G, and B, and three subpixel groups along the second direction respectively display three different primary colors R, G, and B.

For instance, each adjusting unit includes at least two subunits, and each subunit may independently adjust the transmittance thereof.

Figure 13:
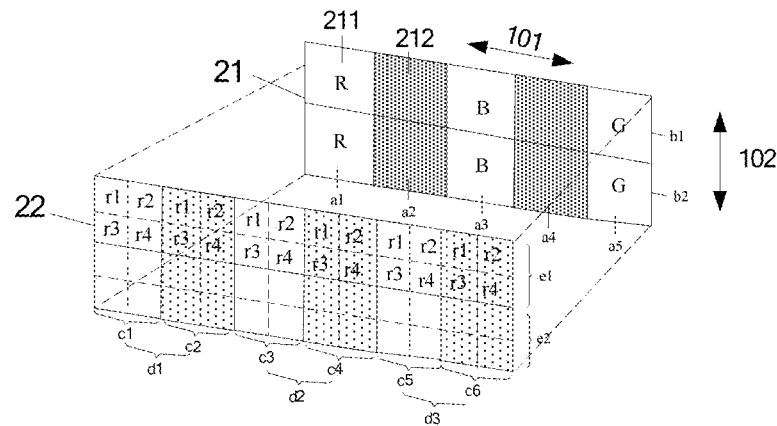
FIG. 13 is a schematic diagram of another implementation example of the display panel as shown in FIG. 3.
Figure 14:
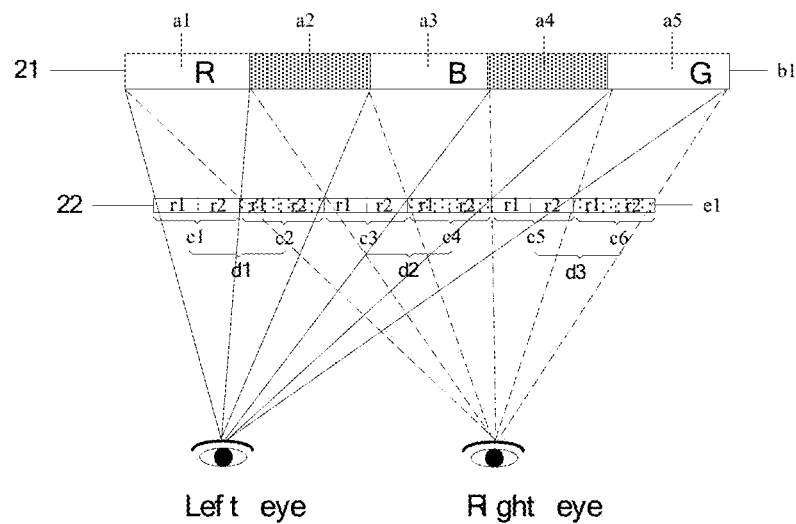
FIG. 14 is a schematic diagram illustrating the process of achieving 3D display in the status of the display panel as shown in FIG. 13.

Taking the b1 and b2 lines and the a1-a4 lines on the display panel 21 as shown in FIG. 3 as an example, as illustrated in FIG. 13, each adjusting unit includes 4 subunits, namely a subunit r1, a subunit r2, a subunit r3 and a subunit r4. As illustrated in FIG. 14, each subunit may independently adjust the transmittance thereof, so that the left eye and the right eye can respectively receive two different gray scales emitted by four first subpixels, namely the left eye receives two different gray scales of the subunit r1 and the subunit r3, and the right eye receives two different gray scales of the subunit r2 and the subunit r4. FIG. 14 only takes the subunit r1 and the subunit r2 as an example, and the display principle of the subunit r3 and the subunit r4 is the same as that of the subunit r1 and the subunit r2, so that the display resolution can be improved. Moreover, exemplarily, each adjusting unit includes n2 subunits arranged in a square, namely each row along the first direction includes n subunits and each column along the second direction includes n subunits, where n is a positive integer greater than or equal to two. In this way, in the case of achieving 3D display by the switching between landscape and portrait, the display resolution can be improved.

Compared with the OLED display panel, the LCD adjusting panel can more readily make smaller adjusting units to allow a plurality of subunits to correspond to one subpixel.

Figure 15:
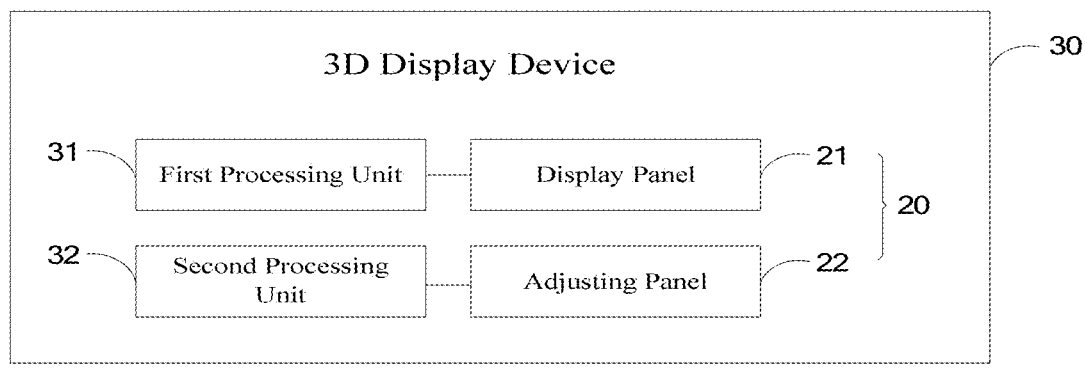
FIG. 15 is a schematic diagram of a 3D display device provided by an embodiment of the present disclosure.

As illustrated in FIG. 15, the embodiment of the present disclosure further provides a 3D display device 30, which includes: the 3D display panel assembly 20 provided by the embodiment of the present disclosure, a first processing unit 31 connected with the display panel 21 in the 3D display panel assembly 20, and a second processing unit 32 connected with the adjusting panel 22 in the 3D display panel assembly 20.

In an instance that the first direction is parallel to the connecting line of the left eye and the right eye, the first processing unit 31 is configured to output first control signals to the display panel 21 in the 3D display panel assembly 20, so that the first subpixel lines in the display panel 21 can emit primary light and the second subpixel lines can display black when the first subpixel lines emit the primary light.

The second processing unit 32 is configured to output first image data to the adjusting panel 22 in the 3D display panel assembly 20, and the first image data includes: the gray scale of the first left-eye adjusting unit and the gray scale of the first right-eye adjusting unit in each first adjusting unit group of the adjusting panel 22. That is to say, the first image data includes the gray scale of the first left-eye adjusting unit and the gray scale of the first right-eye adjusting unit in each first adjusting unit group of the adjusting panel 22.

As illustrated in FIG. 3, the first processing unit is configured to output first control signals to the display panel in the 3D display panel assembly, so that the first subpixel lines in the display panel can emit primary light and the second subpixel lines can display black when the first subpixel lines emit the primary light; and the second processing unit is configured to output first image data to the adjusting panel in the 3D display panel assembly, and the image data include: the gray scale of the first left-eye adjusting unit and the gray scale of the first right-eye adjusting unit in each first adjusting unit group of the adjusting panel, namely the first image data includes the gray scale of each adjusting unit in the adjusting panel. In this way, the second subpixel viewed by the left eye and the right eye through the first left-eye adjusting unit and the first right-eye adjusting unit is black. Each first subpixel corresponds to one first adjusting unit group; and primary light emitted by the first subpixel may run through a first left-eye adjusting unit in corresponding first adjusting unit group and is received by the left eye, and runs through a first right-eye adjusting unit in the first adjusting unit group and is received by the right eye, namely the gray scale of the same first subpixel viewed by the left eye and the right eye is different. In this way, the left-eye image and the right-eye image may be respectively received by the left eye and the right eye, and then, information of different 2D images is superimposed and regenerated via the brain to form an image having 3D effect in the front-back, up-down, left-right and far-near directions, namely a 3D image can be viewed.

For instance, the first image data are 3D image data and include the gray scale of the left-eye image and the gray scale of the right-eye image, and the second processing unit is configured to output the gray scale of the left-eye image to the first left-eye adjusting unit in each first adjusting unit group and output the gray scale of the right-eye image to the first right-eye adjusting unit in each first adjusting unit group. The first left-eye adjusting unit and the first right-eye adjusting unit have different gray scales, so that the left eye and the right eye can view different images, in this way, a 3D image can be displayed.

The first image data are 2D image data, and the processing unit is configured to output the same gray scale to the first left-eye adjusting unit and the first right-eye adjusting unit in the same first adjusting unit group. If the first left-eye adjusting unit and the first right-eye adjusting unit have same gray scale, the image viewed by the left eye and the image viewed by the right eye are same, so that a 2D image can be displayed.

That is to say, the 3D display device provided by the embodiment of the present disclosure not only can be used for displaying a 3D image but also can be used for displaying a 2D image.

Figure 16:
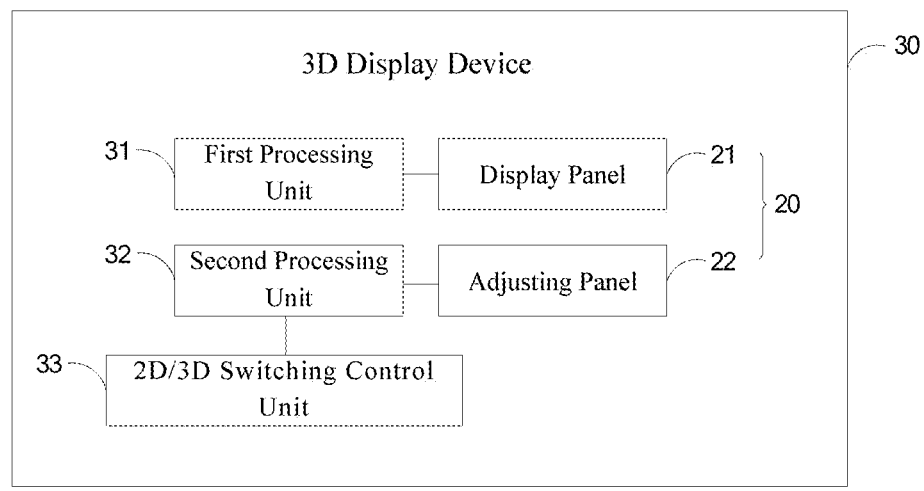
FIG. 16 is a schematic diagram of another 3D display device provided by an embodiment of the present disclosure.

For instance, as illustrated in FIG. 16, the 3D display device 30 further includes a 2D/3D switching control unit 33 connected with the second processing unit 32 and configured to send a switching instruction to the second processing unit 32 when a switching request signal is received.

The second processing unit 32 is also configured to receive the switching instruction sent by the 2D/3D switching control unit 33 and determine the first image data required to be displayed after switching according to the switching instruction.

For instance, the 2D/3D switching control unit 33 may receive the switching request signal sent by the user. The switching request signal may be used for converting the displayed 2D image display mode into the 3D image display mode or converting the displayed 3D image display mode into the 2D image display mode.

The second processing unit 32 is configured to determine the first image data required to be displayed after switching according to the switching instruction. The first image data are 2D image data or 3D image data. The first image data are sent to the adjusting panel, so that the first left-eye adjusting unit and the first right-eye adjusting unit in the first adjusting unit group can have same or different transmittances.

For instance, in an instance that each adjusting unit includes at least two subunits, the first image data include the gray scale of each subunit in each first adjusting unit of each adjusting unit group in the adjusting panel. That is to say, each subunit can have different transmittances, so that multi-gray-scale display can be achieved, so that the display resolution can be improved.

For instance, after the 3D display panel assembly rotates 90 degrees, in an instance that the second direction is parallel to the connecting line of the left eye and the right eye, the first processing unit is also configured to output second control signals to the display panel in the 3D display panel assembly, so that the third subpixel lines in the display panel can emit primary light and the fourth subpixel lines can display black when the third subpixel lines emit the primary light; and the second processing unit is also configured to output second image data to the adjusting panel in the 3D display panel assembly, and the second image data include the gray scale of the second left-eye adjusting unit and the gray scale of the second right-eye adjusting unit in each second adjusting unit group of the adjusting panel.

For instance, the panel assembly as shown in FIG. 5 may be obtained after rotating the display panel assembly as shown in FIG. 3 by 90 degrees. In the panel assembly as shown in FIG. 5, any third subpixel is received by the left eye through the second left-eye adjusting unit 231 and received by the right eye through the second right-eye adjusting unit 232. As the transmittance of the second left-eye adjusting unit 231 and the second right-eye adjusting unit 232 may be different, if the second left-eye adjusting unit 231 has the gray scale of the left-eye image and the second right-eye adjusting unit 232 has the gray scale of the right-eye image, in the same third subpixel, the gray scale of the image viewed by the left eye and the gray scale of the image viewed by the right eye are different. In this way, the left-eye image and the right-eye image are respectively received by the left eye and the right eye, and then, information of different 2D images is superimposed and regenerated via the brain to form an image having 3D effect in the front-back, up-down, left-right and far-near directions, namely a 3D image can be viewed.

For instance, the second image data are 3D image data and include the gray scale of the left-eye image and the gray scale of the right-eye image, and the second processing unit is configured to output the gray scale of the left-eye image to the second left-eye adjusting unit in each second adjusting unit group and output the gray scale of the right-eye image to the second right-eye adjusting unit in each second adjusting unit group; or the second image data are 2D image data, and the processing unit is configured to output same gray scale to the second left-eye adjusting unit and the second right-eye adjusting unit in the same second adjusting unit group.

That is to say, after the 3D display device rotates 90 degrees, the 3D display device can still achieve 3D display or 2D display.

For instance, in an instance that the 3D display device further includes the 2D/3D switching control unit, the second processing unit is also configured to receive the switching instruction sent by the 2D/3D switching control unit and determine the second image data required to be displayed after switching according to the switching instruction.

The second processing unit 32 is configured to determine the second image data required to be displayed after switching according to the switching instruction. The second image data are 2D image data or 3D image data. The second image data are sent to the adjusting panel, so that the second left-eye adjusting unit and the second right-eye adjusting unit in the second adjusting unit group can have same or different transmittances.

That is to say, each subunit can have different transmittances, so that multi-gray-scale display can be achieved, and the display resolution can be improved.

Figure 17:
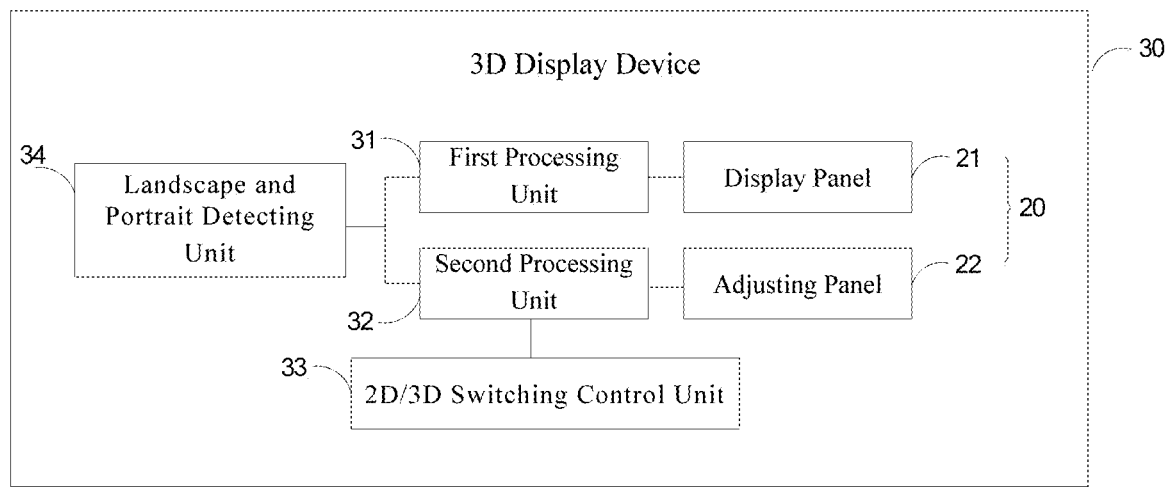
FIG. 17 is a schematic diagram of still another 3D display device provided by an embodiment of the present disclosure.

For instance, in an instance that the first subpixels and the second subpixels respectively include an OLED luminous member, as illustrated in FIG. 17, the 3D display device 30 further includes a landscape and portrait detecting unit 34 connected with the first processing unit 31 and the second processing unit 32 and configured to detect the landscape and portrait status of the 3D display device 30 and send the landscape and portrait status to the first processing unit 31 and the second processing unit 32. For instance, the landscape and portrait detecting unit may detect the landscape and portrait status by a gravity accelerometer.

Description is given below by taking the case that the landscape is as shown in FIG. 3 and the portrait is as shown in FIG. 5 as an example.

The first processing unit 31 is also configured to receive the landscape and portrait status of the 3D display device sent by the landscape and portrait detecting unit 34 and determine the output of the first control signals or the second control signals to the display panel 21 in the 3D display panel assembly 20 according to the landscape and portrait status of the 3D display device 30.

If the detected status of the 3D display device 30 is the landscape status as shown in FIG. 3, the first processing unit 31 is configured to output the first control signals to the display panel 21 in the 3D display panel assembly 20. In this way, any two adjacent lines along the first direction, namely the 101 direction, are respectively a first subpixel line 211 and a second subpixel line 212; first subpixels in the first subpixel line 211 emit primary light; and second subpixels in the second subpixel line 212 are black when the first subpixel line displays the primary light.

If the detected status of the 3D display device 30 is the portrait status as shown in FIG. 5, the first processing unit 31 is configured to output the second control signals to the display panel 21 in the 3D display panel assembly 20. In this way, any two adjacent lines along the second direction, namely the 102 direction, are respectively a third subpixel line 213 and a fourth subpixel line 214; third subpixels in the third subpixel line 213 emit primary light; and fourth subpixels in the fourth subpixel line 214 are black when the third subpixel line 213 displays the primary light.

The second processing unit 32 is also configured to receive the landscape and portrait status of the 3D display device 30 sent by the landscape and portrait detecting unit 34 and determine the output of the first image data or the second image data to the adjusting panel in the 3D display panel assembly according to the landscape and portrait status of the 3D display device 30.

If the detected status of the 3D display device 30 is the landscape status as shown in FIG. 3, the second processing unit 32 is configured to determine the output of the first image data to the adjusting panel 22 in the 3D display panel assembly 20, so that corresponding left-eye image data and right-eye image data in the first image data are respectively outputted to the first left-eye adjusting units and the first right-eye adjusting units. Each line along the second direction (namely the 102 direction as shown in FIG. 3) includes a plurality of continuously arranged adjusting unit groups 220; and each adjusting unit group 220 includes two adjusting units, in which one is a left-eye adjusting unit 221 and the other is a right-eye adjusting unit 222. Primary light emitted by a first subpixel may run through a first left-eye adjusting unit 221 in corresponding first adjusting unit group 220 and is received by the left eye, and runs through a first right-eye adjusting unit 222 in the first adjusting unit group 220 and is received by the right eye.

If the detected status of the 3D display device 30 is the portrait status as shown in FIG. 5, the second processing unit 32 is configured to determine the output of the second image data to the adjusting panel 22 in the 3D display panel assembly 20, so that corresponding left-eye image data and right-eye image data in the second image data can be respectively outputted to the second left-eye adjusting units and the second right-eye adjusting units. Each line along the first direction (namely the 101 direction as shown in FIG. 3) includes a plurality of continuously arranged second adjusting unit groups 230; and each second adjusting unit group 230 includes two adjusting units, in which one is a second left-eye adjusting unit 232 and the other is a second right-eye adjusting unit 232. Primary light emitted by a third subpixel may run through a second left-eye adjusting unit 231 in corresponding second adjusting unit group 230 and is received by the left eye, and runs through a second right-eye adjusting unit 232 in the second adjusting unit group 230 and is received by the right eye.

For instance, in an instance that each adjusting unit includes at least two subunits, the second image data include the gray scale of each subunit in each second adjusting unit group of the adjusting panel.

That is to say, each subunit can have different transmittances, so that multi-gray-scale display can be achieved, and the display resolution can be improved.

Figure 18:
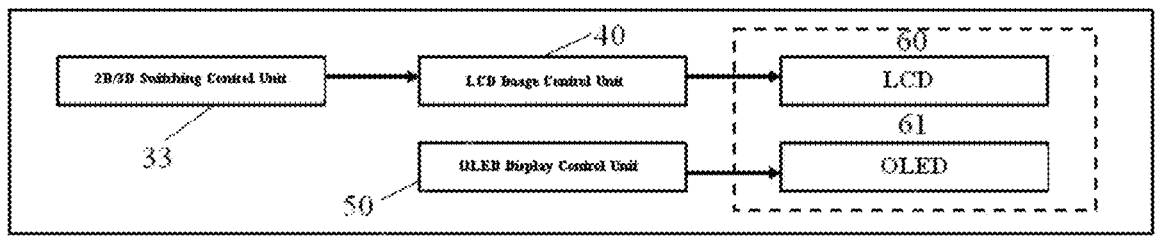
FIG. 18 is a schematic diagram of still another 3D display device provided by an embodiment of the present disclosure.

As illustrated in FIG. 18, for instance, the 3D display device may further include a 2D/3D switching control unit 33 and an LCD image control unit 40 configured to control an image to achieve 3D display in an LCD display device 60; or an OLED display control unit 50 and an OLED display device configured to control the image to achieve 3D display in the OLED display device 61. But the embodiments of the present disclosure are not limited thereto.

Figure 19:
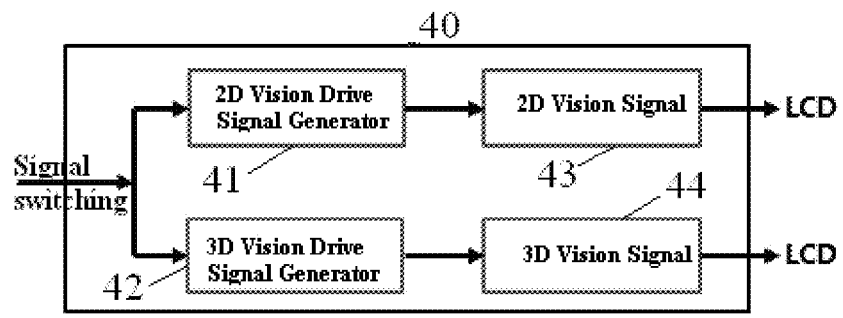
FIG. 19 is a schematic diagram of an LCD image control unit in an embodiment of the present disclosure.

For instance, as illustrated in FIG. 19, a switching signal is sent by the 2D/3D switching control unit 33 to a 2D view drive signal generator 41, and a 2D view signal 43 is generated and sent to an LCD for achieving 2D display. If the switching signal is sent to a 3D view drive signal generator 42, a 3D view signal 44 is generated and sent to the LCD for achieving 3D display. But the embodiments of the present disclosure are not limited thereto.

For instance, the 2D/3D switching control unit may be a touch interface on a display interface of the LCD. But the embodiments of the present disclosure are not limited thereto.

For instance, the OLED control unit may be a common OLED drive circuit.

Figure 20:
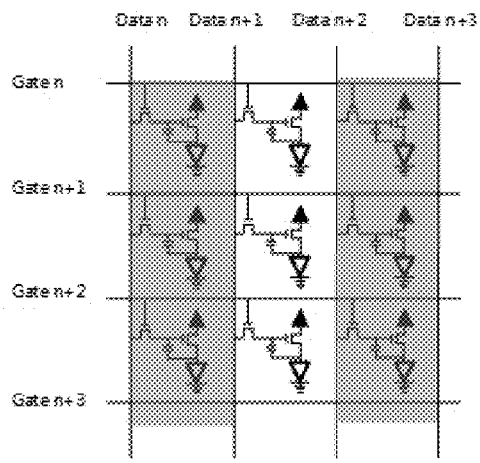
FIG. 20 is a diagram illustrating an arrangement mode of an OLED pixel array in an embodiment of the present disclosure.

For instance, the arrangement mode of an OLED pixel array is as shown in FIG. 20: a plurality of data lines, $Data_n$, $Data_{n+1}$, $Data_{n+2}$, $Data_{n+3}$ ... and a plurality of gate lines, $Gate_n$, $Gate_{+1}$, $Gate_{n+2}$, $Gat_{n+3}$ ... are intersected with each other to form a plurality of pixel regions; each pixel region includes a TFT and a capacitor; and the TFT includes a first electrode, a second electrode and a third electrode which are respectively connected with the data line, the capacitor and the gate line. But the embodiments of the present disclosure are not limited thereto.

As described below, embodiments of the present disclosure provide driving methods applied to the 3D display devices provided by the embodiments of the present disclosure. It is noted that various units in the 3D display devices can execute corresponding steps in the following methods.

Figure 21:
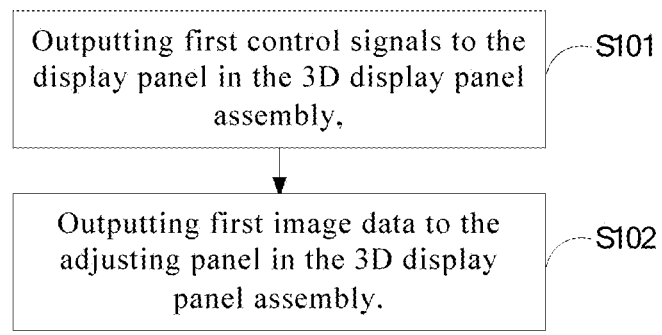
FIG. 21 is a schematic diagram of a driving method of the display panel assembly as shown in FIG. 3 in the 3D display device, provided by an embodiment of the present disclosure.

An embodiment of the present disclosure provides a method for driving a 3D display device, which is applied to the 3D display devices provided by the embodiments of the present disclosure. In an instance that the first direction is parallel to the connecting line of the left eye and the right eye, as illustrated in FIG. 21, the driving method includes following steps.

S101: outputting first control signals to the display panel in the 3D display panel assembly, so that first subpixel lines in the display panel can emit primary light and second subpixel lines can display black when the first subpixel lines emit the primary light.

S102: outputting first image data to a adjusting panel in the 3D display panel assembly, in which the first image data include a gray scale of a first left-eye adjusting unit and a gray scale of a first right-eye adjusting unit in each first adjusting unit group of the adjusting panel.

For instance, the first image data are 3D image data and include the gray scale of the left-eye image and the gray scale of the right-eye image, and the second processing unit is configured to output the gray scale of the left-eye image to the first left-eye adjusting unit in each first adjusting unit group and output the gray scale of the right-eye image to the first right-eye adjusting unit in each first adjusting unit group.

The first image data are 2D image data, and the processing unit is configured to output the same gray scale to the first left-eye adjusting unit and the first right-eye adjusting unit in the same first adjusting unit group.

In an instance that the first image data are 3D image data, the display device achieves 3D display; and in an instance that the first image data are 2D image data, the display device achieves 2D display.

For instance, in an instance that each adjusting unit includes at least two subunits, the first image data include a gray scale of each subunit in each adjusting unit of each first adjusting unit group in the adjusting panel.

Each subunit can have different transmittances, so that multi-gray-scale display can be achieved, and the display resolution can be improved.

Figure 22:
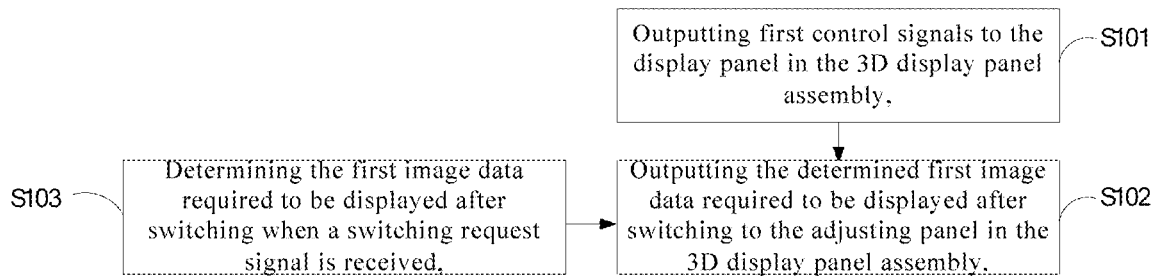
FIG. 22 is a schematic diagram of another driving method of the display panel assembly as shown in FIG. 3 in the 3D display device, provided by an embodiment of the present disclosure.

For instance, as illustrated in FIG. 22, the driving method further includes:

S103: determining the first image data required to be displayed after switching when a switching request signal is received.

The step S102 is for instance outputting the determined first image data required to be displayed after switching to the adjusting panel in the 3D display panel assembly.

Figure 23:
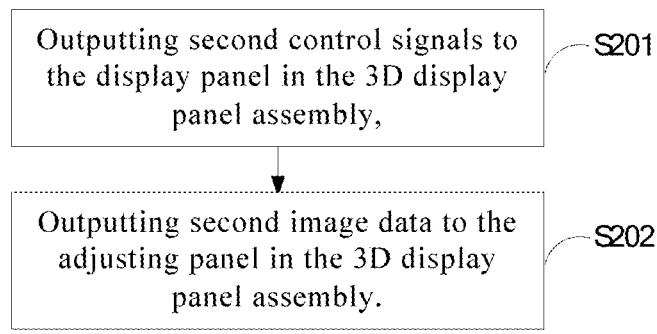
FIG. 23 is a schematic diagram of a driving method of the display panel assembly as shown in FIG. 5 in the 3D display device, provided by an embodiment of the present disclosure.

For instance, in an instance that the second direction is parallel to the connecting line of the left eye and the right eye, as illustrated in FIG. 23, the driving method includes following steps.

S201: outputting second control signals to the display panel in the 3D display panel assembly, so that the third subpixel lines in the display panel can emit primary light and the fourth subpixel lines can display black when the third subpixel lines emit the primary light.

S202: outputting second image data to the adjusting panel in the 3D display panel assembly, in which the second image data include a gray scale of a second left-eye adjusting unit and a gray scale of a second right-eye adjusting unit in each second adjusting unit group of the adjusting panel.

For instance, the second image data are 3D image data and include the gray scale of the left-eye image and the gray scale of the right-eye image, and the second processing unit is configured to output the gray scale of the left-eye image to the second left-eye adjusting unit in each second adjusting unit group and output the gray scale of the right-eye image to the second right-eye adjusting unit in each second adjusting unit group.

Or, the second image data are 2D image data, and the processing unit is configured to output same gray scale to the second left-eye adjusting unit and the second right-eye adjusting unit in the same second adjusting unit group.

Figure 24:
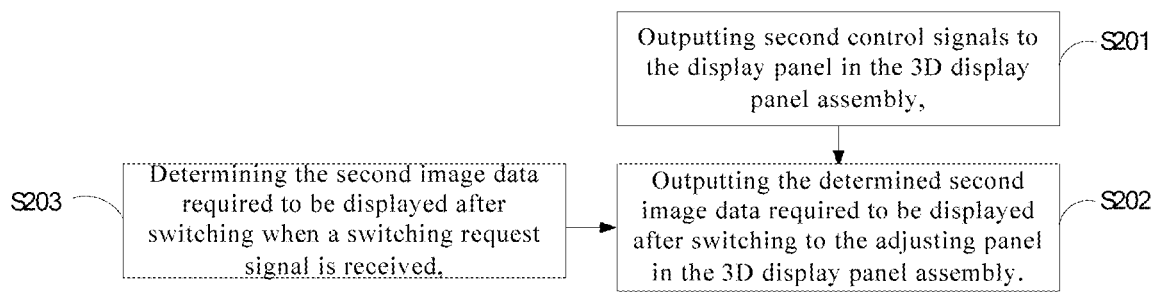
FIG. 24 is a schematic diagram of another driving method of the display panel assembly as shown in FIG. 5 in the 3D display device, provided by an embodiment of the present disclosure.

For instance, as illustrated in FIG. 24, the driving method further includes following step.

Before outputting the second image data to the adjusting panel in the 3D display panel assembly, S203: determining the second image data required to be displayed after switching when the switching request signal is received.

The step S201 is, for instance: outputting the determined second image data required to be displayed after switching to the adjusting panel in the 3D display panel assembly.

Figure 25:
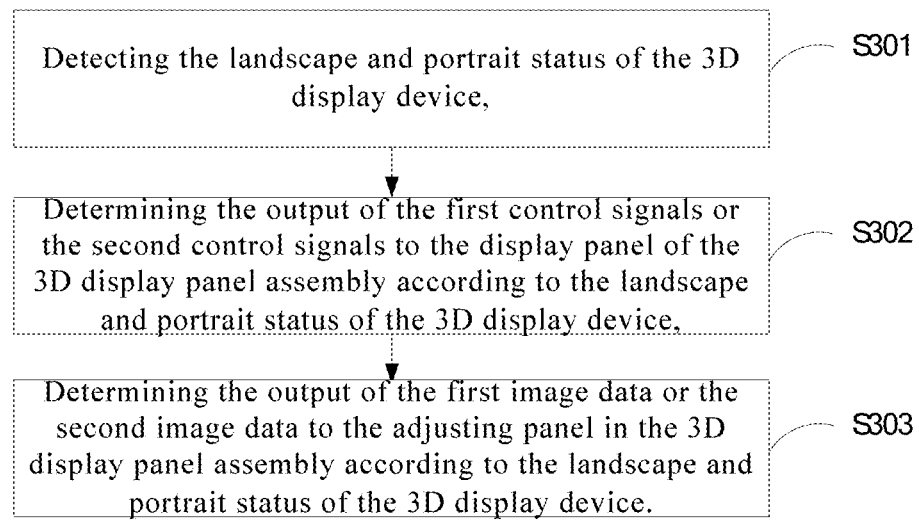
FIG. 25 is a schematic diagram of a driving method illustrating landscape and portrait switching in the 3D display device, provided by an embodiment of the present disclosure.

For instance, in an instance that the subpixels on the display panel respectively include an OLED luminous member, as illustrated in FIG. 25, the driving method further includes following steps.

Before outputting the first control signals or the second control signals to the display panel in the 3D display panel assembly, and before outputting the first image data or the second image data to the adjusting panel in the 3D display panel assembly, S301: detecting the landscape and portrait status of the 3D display device.

S302: determining the output of the first control signals or the second control signals to the display panel of the 3D display panel assembly according to the landscape and portrait status of the 3D display device.

S303: determining the output of the first image data or the second image data to the adjusting panel in the 3D display panel assembly according to the landscape and portrait status of the 3D display device.

The step S101 is for instance: determining the output of the first control signals or the second control signals to the display panel in the 3D display panel assembly according to the landscape and portrait status of the 3D display device.

If the detected status of the 3D display device 30 is the landscape status as shown in FIG. 3, the first processing unit 31 is configured to output the first control signals to the display panel 21 in the 3D display panel assembly 20. In this way, any two adjacent lines along the first direction, namely the 101 direction, are respectively a first subpixel line 211 and a second subpixel line 212; first subpixels in the first subpixel line 211 emit primary light; and second subpixels in the second subpixel line 212 are black when the first subpixel line displays the primary light.

If the detected status of the 3D display device 30 is the portrait status as shown in FIG. 5, the first processing unit 31 is configured to output the second control signals to the display panel 21 in the 3D display panel assembly 20. In this way, any two adjacent lines along the second direction, namely the 102 direction, are respectively a third subpixel line 213 and a fourth subpixel line 214; third subpixels in the third subpixel line 213 emit primary light; and fourth subpixels in the fourth subpixel line 214 are black when the third subpixel line 213 displays the primary light.

The step S102 is for instance: determining the output of the first image data or the second image data to the adjusting panel in the 3D display panel assembly according to the landscape and portrait status of the 3D display device.

If the detected status of the 3D display device 30 is the landscape status as shown in FIG. 3, the second processing unit 32 is configured to determine the output of the first image data to the adjusting panel 22 in the 3D display panel assembly 20, so that corresponding left-eye image data and right-eye image data in the first image data are respectively outputted to the first left-eye adjusting units and the first right-eye adjusting units. Each line along the second direction (namely the 102 direction as shown in FIG. 3) includes a plurality of continuously arranged first adjusting unit groups 220; and each first adjusting unit group 220 includes two adjusting units, in which one is a first left-eye adjusting unit 221 and the other is a first right-eye adjusting unit 222. Primary light emitted by a first subpixel may run through a first left-eye adjusting unit in corresponding first adjusting unit group and is received by the left eye, and runs through a first right-eye adjusting unit in the first adjusting unit group and is received by the right eye.

If the detected status of the 3D display device 30 is the portrait status as shown in FIG. 5, the second processing unit 32 is configured to determine the output of the second image data to the adjusting panel 22 in the 3D display panel assembly 20, so that corresponding left-eye image data and right-eye image data in the second image data are respectively outputted to the second left-eye adjusting units and the second right-eye adjusting units. Each line along the first direction (namely the 101 direction as shown in FIG. 3) includes a plurality of continuously arranged second adjusting unit groups 230; and each second adjusting unit group 230 includes two adjusting units, in which one is a second left-eye adjusting unit 231 and the other is a second right-eye adjusting unit 232. Primary light emitted by a third subpixel may run through a second left-eye adjusting unit in corresponding second adjusting unit group and is received by the left eye, and runs through a second right-eye adjusting unit in the second adjusting unit group and is received by the right eye.

For instance, in an instance that each adjusting unit includes at least two subunits, the second image data include a gray scale of each subunit in each adjusting unit of each second adjusting unit group in the adjusting panel.

That is to say, each subunit can have different transmittances, so that multi-gray-scale display can be achieved, and the display resolution can be improved.

Figure 26:
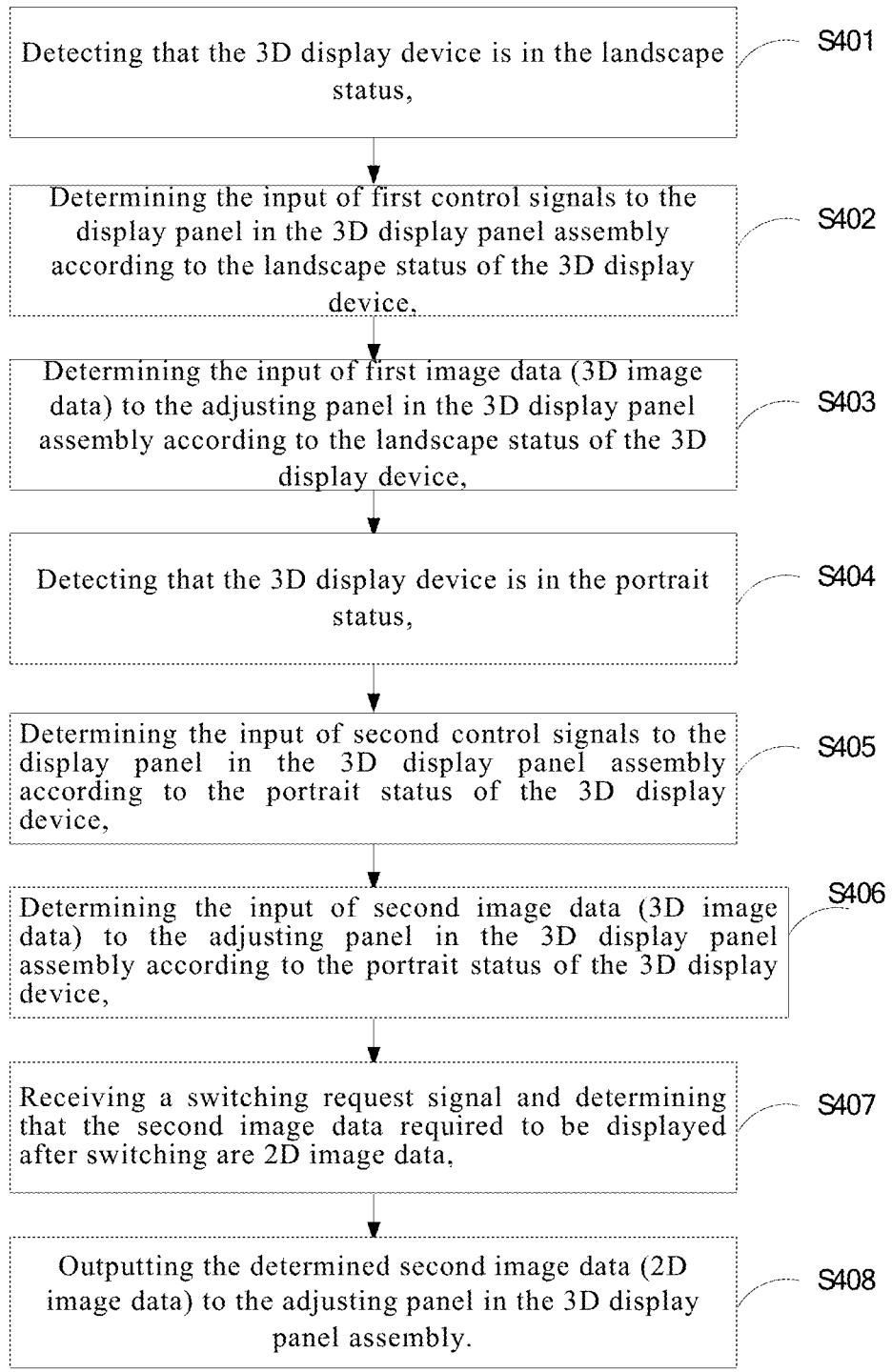
FIG. 26 is a schematic diagram of another driving method illustrating landscape and portrait switching in the 3D display device, provided by an embodiment of the present disclosure.

As described below, the embodiment of the present disclosure provides an example to describe the driving method of the 3D display device provided by the embodiment of the present disclosure. Description is given below by taking the case that the 3D display device is a tablet PC as an example, in which the landscape status of the tablet PC may be as shown in FIG. 3 and the portrait status of the tablet PC may be as shown in FIG. 5. Taking the case that the tablet PC displays a 3D image as an example, as illustrated in FIG. 26, the driving method includes following steps.

S401: detecting that the 3D display device is in the landscape status.

That is to say, the tablet PC is in the landscape status as shown in FIG. 3 through detection.

S402: determining the input of first control signals to the display panel in the 3D display panel assembly according to the landscape status of the 3D display device.

As illustrated in FIG. 3, the first subpixel lines 211 in the display panel 21 emit primary light, and the second subpixel lines 212 are black when the first subpixel lines 211 emit the primary light.

S403: determining the input of first image data (3D image data) to the adjusting panel in the 3D display panel assembly according to the landscape status of the 3D display device.

The first image data include a gray scale of a first left-eye adjusting unit 221 and a gray scale of a first right-eye adjusting unit 222 in each first adjusting unit group 220 of an adjusting panel 22, so that the left eye and the right eye can view different images, and 3D display can be achieved.

S404: detecting that the 3D display device is in the portrait status.

That is to say, the tablet PC is in the landscape status as shown in FIG. 5 through detection.

S405: determining the input of second control signals to the display panel in the 3D display panel assembly according to the portrait status of the 3D display device.

As illustrated in FIG. 5, the third subpixel lines 213 in the display panel 21 emit primary light, and the fourth subpixel lines 214 are black when the third subpixel lines 213 emit the primary light.

S406: determining the input of second image data (3D image data) to the adjusting panel in the 3D display panel assembly according to the portrait status of the 3D display device.

The second image data include a gray scale of a second left-eye adjusting unit 231 and a gray scale of a second right-eye adjusting unit 232 in each second adjusting unit group 230 of the adjusting panel 22, so that the left eye and the right eye can view different images, and 3D display can be achieved.

S407: receiving a switching request signal and determining that the second image data required to be displayed after switching are 2D image data.

The switching request is, for instance, converting 3D display into 2D display, namely the second image data required to be displayed after switching are determined to be 2D image data.

S408: outputting the determined second image data (2D image data) to the adjusting panel in the 3D display panel assembly.

The second image data are 2D image data, and the same gray scale is outputted to the second left-eye adjusting unit 231 and the second right-eye adjusting unit 232 in the same second adjusting unit group 230, so that the left eye and the right eye can view a same image.

The embodiments of the present disclosure provide a 3D display panel assembly, a 3D display device and a driving method thereof. The display panel includes the subpixels arranged in an array; any two adjacent lines in various lines of subpixels are respectively the first subpixel line and the second subpixel line; the first subpixel line includes the first subpixels and is configured to emit the primary light; and the second subpixel line includes the second subpixels and is configured to display black when the first subpixel line displays an image. The adjusting panel includes the adjusting units arranged in an array; the adjusting unit is configured to adjusting the light transmittance; each line includes the plurality of continuously arranged adjusting unit groups; and each adjusting unit group includes two adjusting units, in which one is the left-eye adjusting unit and the other is the right-eye adjusting unit. The second subpixel viewed by the left eye and the right eye through the left-eye adjusting unit and the right-eye adjusting unit is black. Each first subpixel corresponds to one adjusting unit group; and primary light emitted by the first subpixel may run through a left-eye adjusting unit in corresponding adjusting unit group and is received by the left eye, and runs through a right-eye adjusting unit in the adjusting unit group and is received by the right eye, namely the gray scale of the same first subpixel viewed by the left eye and the right eye is different. In this way, the left-eye image and the right-eye image may be respectively received by the left eye and the right eye, and then, information of different 2D images is superimposed and regenerated via the brain to form an image having 3D effect in the front-back, up-down, left-right and far-near directions, namely a 3D image can be viewed.

The foregoing is only the exemplary embodiments of the present disclosure and not intended to limit the scope of the present disclosure. All the changes or alternations which may be readily contemplated by an ordinary skill in the art within the technical scope disclosed by the embodiments of the present disclosure shall fall within the scope of the present disclosure.

The present application claims priority to the Chinese patent application No. 201510907679.7, filed on Dec. 9, 2015 and entitled "3D Display Panel Assembly, 3D Display Device and Driving Method thereof", which is incorporated herein by reference in its entirety.

What is claimed is:

1. A 3D display panel assembly, comprising a display panel and an adjusting panel provided on a light-emitting side of the display panel, wherein
   the display panel comprises a plurality of subpixels arranged in an array, in which the plurality of subpixels are arranged in a plurality of lines along a first direction and arranged in a plurality of lines along a second direction; the first direction is parallel to a connecting line of a left eye and a right eye; any two adjacent lines along the first direction are respectively a first subpixel line and a second subpixel line; each first subpixel line includes first subpixels, all of the first subpixels are of a same first color to form a first stripe pixel structure and configured to emit primary light; each second subpixel line includes second subpixels, all of the second subpixels are of a same second color to form a second stripe pixel structure and configured to display black when the first subpixel line emits the primary light;
   the adjusting panel includes a plurality of adjusting units arranged in an array, in which the plurality of adjusting units are arranged in a plurality of lines along the first direction and arranged in a plurality of lines along the second direction; each adjusting unit is configured to adjust light transmittance; each line along the second direction includes a plurality of continuously arranged first adjusting unit groups; each first adjusting unit group includes two adjusting units, in which one is a first left-eye adjusting unit and the other is a first right-eye adjusting unit;
   each first subpixel corresponds to one first adjusting unit group, and primary light emitted by the first subpixel passes through a first left-eye adjusting unit in a corresponding first adjusting unit group and is received by the left eye, and passes through a first right-eye adjusting unit in the corresponding first adjusting unit group and is received by the right eye; and
   the first direction and the second direction are perpendicular to each other.

2. The 3D display panel assembly according to claim 1, wherein if the 3D display panel assembly is rotated 90 degrees and the second direction is parallel to the connecting line of the left eye and the right eye,
- any two adjacent lines along the second direction in the display panel are respectively a third subpixel line and a fourth subpixel line; the third subpixel line includes third subpixels configured to emit primary light; the fourth subpixel line includes fourth subpixels configured to display black when the third subpixel line emits the primary light;
- each line along the first direction in the adjusting panel includes a plurality of continuously arranged second adjusting unit groups; each second adjusting unit group includes two adjusting units, in which one is a second left-eye adjusting unit and the other is a second right-eye adjusting unit;
- each third subpixel corresponds to one second adjusting unit group; and primary light emitted by the third subpixel passes through a second left-eye adjusting unit in corresponding second adjusting unit group and is received by the left eye, and passes through a second right-eye adjusting unit in the second adjusting unit group and is received by the right eye.

3. The 3D display panel assembly according to claim 1, wherein
- any three adjacent subpixels along at least one of the first direction or the second direction may respectively display three different primary colors R, G, and B.

4. The 3D display panel assembly according to claim 1, wherein the display panel is an organic light-emitting diode (OLED) display panel;
- each of the first subpixel and the second subpixels includes an OLED luminous unit; or
- the first subpixel includes an OLED luminous unit, and a black matrix (BM) is provided at a corresponding position of the second subpixel.

5. The 3D display panel assembly according to claim 1, wherein the adjusting panel is a liquid crystal display (LCD) adjusting panel which includes an array substrate and a package substrate which are cell-assembled, and liquid crystals provided between the array substrate and the package substrate, and wherein common electrodes and pixel electrodes arranged in an array are formed on the array substrate and/or the package substrate, and each adjusting unit includes a pixel electrode.

6. The 3D display panel assembly according to claim 1, wherein four subpixels of two adjacent lines along the first direction and two adjacent lines along the second direction form a subpixel group, each subpixel group displays a same color, and any three adjacent sub-pixels groups along the first direction and the second direction respectively display three different primary colors R, G, and B.

7. The 3D display panel assembly according to claim 1, wherein two adjacent lines along the second direction are respectively a third subpixel line and a fourth subpixel line, part of third subpixels in each third subpixel line do not display a primary color but display back, to allow the part of the third subpixels and the fourth subpixel lines to be intersected to each other to form a black matrix.

8. The 3D display panel assembly according to claim 1, wherein each adjusting unit comprises n×n subunits arranged in a square corresponding to a subpixel group including n×n subpixels, where n is a positive integer greater than or equal to two.

9. The 3D display panel assembly according to claim 8, each adjusting unit comprises four subunits arranged in the square, including a first subunit, a second subunit, a third subunit, and a fourth subunit, each subunit independently adjusts a transmittance thereof, to allow the left eye and the right eye to respectively receive two different gray scales emitted by four first subpixels.

10. The 3D display panel assembly according to claim 9, wherein the first subunit, the second subunit, the third subunit, and the fourth subunit are configured to allow the left eye to receive two different gray scales of the first subunit and the third subunit, and to allow the right eye to receive two different gray scales of the second subunit and the fourth subunit, respectively.

11. A 3D display device, comprising:
- a 3D display panel assembly, wherein the 3D display panel assembly comprises:
  - a display panel and an adjusting panel provided on a light-emitting side of the display panel, wherein
  - the display panel comprises a plurality of subpixels arranged in an array, in which the plurality of subpixels are arranged in a plurality of lines along a first direction and arranged in a plurality of lines along a second direction; the first direction is parallel to a connecting line of a left eye and a right eye; any two adjacent lines along the first direction are respectively a first subpixel line and a second subpixel line; each first subpixel line includes first subpixels, all of the first subpixels are of a same first color to form a first stripe pixel structure and configured to emit primary light; each second subpixel line includes second subpixels, all of the second subpixels are of a same second color to form a second stripe pixel structure and configured to display black when the first subpixel line emits the primary light;
  - the adjusting panel includes a plurality of adjusting units arranged in an array, in which the plurality of adjusting units are arranged in a plurality of lines along the first direction and arranged in a plurality of lines along the second direction; each adjusting unit is configured to adjust light transmittance; each line along the second direction includes a plurality of continuously arranged first adjusting unit groups; each first adjusting unit group includes two adjusting units, in which one is a first left-eye adjusting unit and the other is a first right-eye adjusting unit;
  - each first subpixel corresponds to one first adjusting unit group, and primary light emitted by the first subpixel passes through a first left-eye adjusting unit in a corresponding first adjusting unit group and is received by the left eye, and passes through a first right-eye adjusting unit in the corresponding first adjusting unit group and is received by the right eye; and
  - the first direction and the second direction are perpendicular to each other;
- a first processing unit connected with the display panel, and a second processing unit connected with the adjusting panel,
- wherein if the first direction is parallel to the connecting line of the left eye and the right eye, the first processing unit is configured to output first control signals to the display panel, so that the first subpixel lines can emit primary light and the second subpixel lines can display black when the first subpixel lines emit the primary light; and
- the second processing unit is configured to output first image data to the adjusting panel, and the first image data includes a gray scale of the first left-eye adjusting unit and a gray scale of the first right-eye adjusting unit in each first adjusting unit group of the adjusting panel.

12. The 3D display device according to claim 11, wherein the first image data are 3D image data and include a gray scale of a left-eye image and a gray scale of a right-eye image, and the second processing unit is configured to output the gray scale of the left-eye image to the first left-eye adjusting unit in each first adjusting unit group, and output the gray scale of the right-eye image to the first right-eye adjusting unit in each first adjusting unit group; or the first image data are 2D image data, and the second processing unit is configured to output a same gray scale to the first left-eye adjusting unit and the first right-eye adjusting unit in a same first adjusting unit group.

13. The 3D display device according to claim 11, wherein if the 3D display panel assembly is rotated 90 degrees and the second direction is parallel to the connecting line of the left eye and the right eye, the first processing unit is further configured to output second control signals to the display panel, so that third subpixel lines in the display panel can emit primary light and fourth subpixel lines can display black when the third subpixel lines emit the primary light; and the second processing unit is further configured to output second image data to the adjusting panel, and the second image data includes a gray scale of a second left-eye adjusting unit and a second right-eye adjusting unit respectively in each second adjusting unit group of a plurality of second adjusting unit groups of the adjusting panel.

14. The 3D display device according to claim 13, wherein the second image data are 3D image data and include a gray scale of a left-eye image and a gray scale of a right-eye image, and the second processing unit is configured to output the gray scale of the left-eye image to the second left-eye adjusting unit in each second adjusting unit group, and output the gray scale of the right-eye image to the second right-eye adjusting unit in each second adjusting unit group; or the second image data are 2D image data, and the second processing unit is configured to output a same gray scale to the second left-eye adjusting unit and the second right-eye adjusting unit in a same second adjusting unit group.

15. The 3D display device according to claim 13, wherein the subpixels each include an OLED luminous unit, and the 3D display device further comprises:

a landscape and portrait detecting unit connected with the first processing unit and the second processing unit and configured to detect a landscape and portrait status of the 3D display device and send the landscape and portrait status to the first processing unit and the second processing unit; and wherein the first processing unit is further configured to receive the landscape and portrait status, and determine an output of the first control signals or the second control signals to the display panel according to the landscape and portrait status; and the second processing unit is further configured to receive the landscape and portrait status, and determine the output of the first image data or the second image data to the adjusting panel according to the landscape and portrait status.

16. A method for driving the 3D display device according to claim 11, if the first direction is parallel to the connecting line of the left eye and the right eye, the method comprises:

outputting first control signals to the display panel, so that the first subpixel lines can emit primary light and the second subpixel lines can display black when the first subpixel lines emit the primary light; and outputting first image data to the adjusting panel, in which the first image data include the gray scale of the first left-eye adjusting unit and the gray scale of the first right-eye adjusting unit in each first adjusting unit group of the adjusting panel.

17. The method according to claim 16, wherein the first image data are 3D image data and includes a gray scale of a left-eye image and a gray scale of a right-eye image, and the second processing unit is configured to output the gray scale of the left-eye image to the first left-eye adjusting unit in each first adjusting unit group, and output the gray scale of the right-eye image to the first right-eye adjusting unit in each first adjusting unit group; or the first image data are 2D image data, and the second processing unit is configured to output a same gray scale to the first left-eye adjusting unit and the first right-eye adjusting unit in a same first adjusting unit group.

18. The method according to claim 17, further comprising:

before outputting the first image data to the adjusting panel, determining first image data required to be displayed after switching when a 2D/3D switching request signal is received.

19. The method according to claim 16, wherein if the 3D display panel assembly is rotated 90 degrees and the second direction is parallel to the connecting line of the left eye and the right eye, the method comprises:

outputting second control signals to the display panel, so that third subpixel lines in the display panel can emit primary light and fourth subpixel lines can display black when the third subpixel lines emit the primary light; and outputting second image data to the adjusting panel, in which the second image data include a gray scale of a second left-eye adjusting unit and a gray scale of a second right-eye adjusting unit in each second adjusting unit group of the adjusting panel.

20. The method according to claim 19, wherein the second image data are 3D image data and include a gray scale of a left-eye image and a gray scale of a right-eye image, and the second processing unit is configured to output the gray scale of the left-eye image to the second left-eye adjusting unit in each second adjusting unit group, and output the gray scale of the right-eye image to the second right-eye adjusting unit in each second adjusting unit group; or the second image data are 2D image data, and the second processing unit is configured to output a same gray scale to the second left-eye adjusting unit and the second right-eye adjusting unit in a same second adjusting unit group.

21. The method according to claim 19, further comprising:

before outputting the second image data to the adjusting panel, determining second image data required to be displayed after switching when a switching request signal is received;

if the subpixels on the display panel respectively include an OLED luminous unit, before outputting the first control signals or the second control signals to the display panel, and before outputting the first image data or the second image data to the adjusting panel detecting a landscape and portrait status of the 3D display device;

determining the output of the first control signals or the second control signals to the display panel according to the landscape and portrait status of the 3D display device; and determining the output of the first image data or the second image data to the adjusting panel according to the landscape and portrait status of the 3D display device.

22. The 3D display device according to claim 11, wherein four subpixels of two adjacent lines along the first direction and two adjacent lines along the second direction form a subpixel group, each subpixel group displays a same color, and any three adjacent subpixels groups respectively display three different primary colors R, G, and B.

* * * * *